(12) United States Patent
Hsing et al.

(10) Patent No.: US 11,002,782 B2
(45) Date of Patent: May 11, 2021

(54) METHOD FOR DETERMINING FAILURE OF POWER ELEMENT AND ELECTRONIC DEVICE THEREOF

(71) Applicant: Delta Electronics, Inc., Taoyuan (TW)

(72) Inventors: Lei-Chung Hsing, Taoyuan (TW); Hsien-Chih Ou, Taoyuan (TW); Chun-Chang Huang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 125 days.

(21) Appl. No.: 16/507,969

(22) Filed: Jul. 10, 2019

(65) Prior Publication Data

US 2020/0033394 A1    Jan. 30, 2020

(30) Foreign Application Priority Data

Jul. 26, 2018  (CN) .......................... 201810836094.4

(51) Int. Cl.
*G01R 31/26* (2020.01)
(52) U.S. Cl.
CPC ................ *G01R 31/2619* (2013.01)
(58) Field of Classification Search
CPC .. G01R 31/2619; G01R 31/263; G01R 31/64; G01R 31/2875; G01R 31/2628; G01R 31/2601
USPC .............. 324/762.08, 762.01, 537, 512, 500
See application file for complete search history.

(56) References Cited

U.S. PATENT DOCUMENTS

| | | | |
|---|---|---|---|
| 2014/0248168 A1* | 9/2014 | Chantriaux | B64C 27/14 417/410.1 |
| 2019/0277537 A1* | 9/2019 | McCullough | G05B 17/02 |
| 2019/0348002 A1* | 11/2019 | Dunn | G09G 3/3426 |

FOREIGN PATENT DOCUMENTS

TW            201824040 A       7/2018

* cited by examiner

*Primary Examiner* — Giovanni Astacio-Oquendo
(74) *Attorney, Agent, or Firm* — Muncy, Geissler, Olds & Lowe, P.C.

(57) ABSTRACT

A method for determining failure of a power element for use in an electronic device is provided. The electronic device includes a power element and a detection circuit. The method includes the steps of: obtaining a temperature-calculation model of the power element, and obtaining a parameterized temperature-calculation model of a power-element parameter and a parameterized temperature of the power element; detecting load information and the power-element parameter by the detection circuit; calculating a modeled temperature of the power element according to the load information and the temperature-calculation model, and calculating the parameterized temperature of the power element according to the power-element parameter and the parameterized temperature-calculation model; determining whether an error between the modeled temperature and the parameterized temperature exceeds a permitted range; and determining that the power element has failed in response to the error exceeding the permitted range.

14 Claims, 13 Drawing Sheets

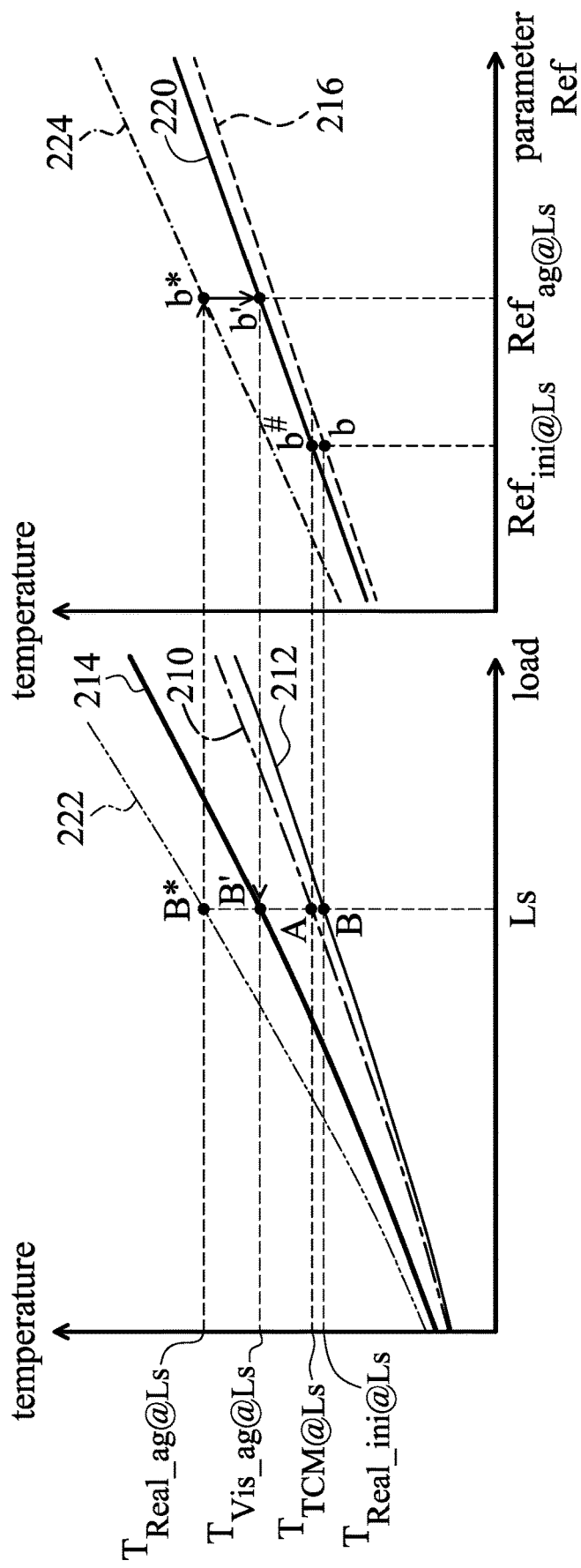

METHOD FOR DETERMINING FAILURE OF POWER ELEMENT AND ELECTRONIC DEVICE THEREOF

CROSS REFERENCE TO RELATED APPLICATIONS

This Application claims priority of China Patent Application No. 201810836094.4, filed on Jul. 26, 2018, the entirety of which is incorporated by reference herein.

BACKGROUND OF THE INVENTION

Field of the Invention

The present invention relates to power elements, and, in particular, to a method for determining failure of a power element and an electronic device using the same.

Description of the Related Art

Power elements can be damaged when their fatigue strength is exceeded. Other common power element failures may be caused by fatigue of the power element. Fatigue refers to a change in material properties caused by dynamic stress repetitively applied to the structure of the power element, resulting in damage to the power element. The strength and stress of the structure of the power element may indicate the temperature limit of the power element and the heat stress caused by temperature variations. There are two limits for a power-element module: the limit to the temperature when the integrated circuit (IC) is operating in the power-element module, and the fatigue curve of the integrated circuit's temperature, which represents the relationship between heat stress (e.g., temperature difference) and stress cycles. Accordingly, there are two main causes of damage to the power element: the operating temperature of the integrated circuit exceeds the limit temperature, and the accumulated heat stress exceeds the fatigue strength of the power element.

The product lifespan of a power-element module is conventionally estimated using a thermal network model to calculate the current temperature and variations of the temperature in real time, and the damage caused to the power-element module is calculated or defined using the fatigue curve of the power-element module. When the damage caused to the power-element module has accumulated and reached the limit of the power-element module, it can be determined that the power-element module has reached the end of its lifespan, and a warning message can be displayed to advise the user to change the power-element module.

However, the method for calculating the life of a power-element module using accumulated damage has some disadvantages. First, uncertainty is introduced into the lifespan estimation. The fatigue curve of the power-element module is the result of various tests in a specific operating condition and is statistically obtained after several sets of experiments. In actual operation, the operating conditions and operating time of the estimated fatigue curve are different from those in actual operations, which can be calculated using a conversion ratio. However, there will be a conversion error between them. In addition, the fatigue curve of the power-element module is a statistical result, and each power-element module may differ in performance due to differences in batch or manufacturing process variations. If the above method is used for calculating the lifespan of the power-element module, only a rough estimate of the lifespan can be obtained, which is not accurate.

Second, the real process of the variations of the temperature of the power-element module cannot be considered. The aging of the power-element module may cause differences in thermal resistance or thermal loss. If a fixed thermal resistance and thermal capacitance are used to calculate the temperature of the power-element module, the calculated temperature may be different from the real temperature of the power-element module after the power-element module has been operating for a long time. Therefore, if fixed thermal network parameters are used, the calculated temperature of the power-element module will be underestimated, resulting in an underestimation of damage and an overestimation of lifespan.

Accordingly, there is demand for a method for determining failure of a power element and an associated electronic device to solve the aforementioned problems.

BRIEF SUMMARY OF THE INVENTION

A detailed description is given in the following embodiments with reference to the accompanying drawings.

In an exemplary embodiment, a method for determining failure of a power element for use in an electronic device is provided. The electronic device comprises a power element and a detection circuit. The method includes the steps of: obtaining a temperature-calculation model of the power element, and obtaining a parameterized temperature-calculation model of a power-element parameter and a parameterized temperature of the power element; detecting load information and the power-element parameter by the detection circuit; calculating a modeled temperature of the power element according to the load information and the temperature-calculation model, and calculating the parameterized temperature of the power element according to the power-element parameter and the parameterized temperature-calculation model; determining whether an error between the modeled temperature and the parameterized temperature exceeds a permitted range; and determining that the power element has failed in response to the error exceeding the permitted range.

In another exemplary embodiment, a method for determining failure of a power element for use in an electronic device is provided. The electronic device comprises a power element and a detection circuit. The method includes the steps of: obtaining a temperature-calculation model of the power element, and obtaining a first equation between a power-element parameter and a parameterized temperature of the power element; building a second equation between a modeled temperature calculated by the temperature-calculation model and a corresponding modeled power-element parameter; detecting a temperature of the power element by the detection circuit; calculating the modeled power-element parameter according to the detected temperature and the second equation, and calculating the power-element parameter of the power element according to the detected temperature and the first equation; determining whether an error between the modeled power-element parameter and the power-element parameter exceeds a permitted range; and determining that the power element has failed in response to the error exceeding the permitted range.

In yet another exemplary embodiment, a method for determining failure of a power element for use in an electronic device is provided. The electronic device comprises a power element and a detection circuit. The method includes the steps of: obtaining a temperature-calculation model of the power element; building an equation between the temperature-calculation model, a power-element parameter and a parameterized temperature of the power element; detecting load information and the power-element parameter by the detection circuit; calculating a modeled temperature of the power element according to the load information and the temperature-calculation model, and calculating the parameterized temperature of the power element according to the power-element parameter and the temperature-calculation model; determining whether an error between the modeled temperature and the parameterized temperature exceeds a permitted range; and determining that the power element has failed in response to the error exceeding the permitted range.

In yet another exemplary embodiment, a method for determining failure of a power element for use in an electronic device is provided. The electronic device comprises a power element and a detection circuit. The method includes the steps of: obtaining a temperature-calculation model of the power element; building an equation between a modeled power-element parameter and a modeled temperature of the power element; detecting load information and a power-element parameter by the detection circuit; calculating the modeled power-element parameter of the power element according to the load information and the temperature-calculation model by the equation; determining whether an error between the modeled power-element parameter and the power-element parameter exceeds a permitted range; and determining that the power element has failed in response to the error exceeding the permitted range.

In yet another exemplary embodiment, an electronic device is provided. The electronic includes: a power element, a detection circuit, and a controller. The detection circuit is configured to detect load information and a power-element parameter of the power element. The controller is configured to obtain a temperature-calculation model of the power element, and obtain a parameterized temperature-calculation model of a power-element parameter and a parameterized temperature of the power element. The controller is further configured to calculate a modeled temperature of the power element according to the load information and the temperature-calculation model, and calculate the parameterized temperature of the power element according to the power-element parameter and the parameterized temperature-calculation model. The controller is further configured to determine whether an error between the modeled temperature and the parameterized temperature exceeds a permitted range. In response to the error exceeding the permitted range, the controller determines that the power element has failed. In response to the error not exceeding the permitted range, the controller controls the electronic device to operate normally.

In yet another exemplary embodiment, an electronic device is provided. The electronic device includes: a power element, a detection circuit, and a controller. The detection circuit is configured to detect load information and a power-element parameter of the power element. The controller is configured to obtain a temperature-calculation model of the power element, and build an equation between the temperature-calculation model, the power-element parameter and a parameterized temperature of the power element. The controller is further configured to calculate a modeled temperature of the power element according to the load information and the temperature-calculation model, and calculate the parameterized temperature of the power element according to the power-element parameter and the temperature-calculation model by the equation. The controller is further configured to determine whether an error between the modeled temperature and the parameterized temperature exceeds a permitted range. In response to the error exceeding the permitted range, the controller determines that the power element has failed. In response to the error not exceeding the permitted range, the controller controls the electronic device to operate normally.

BRIEF DESCRIPTION OF THE DRAWINGS

The present invention can be more fully understood by reading the subsequent detailed description and examples with references made to the accompanying drawings, wherein:

FIG. 7A is a diagram of the relationship between the load information and temperature in accordance with another embodiment in the third aspect of the invention;

FIG. 7B is a diagram of the relationship between the power-element parameter and temperature in accordance with another embodiment in the third aspect of the invention;

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
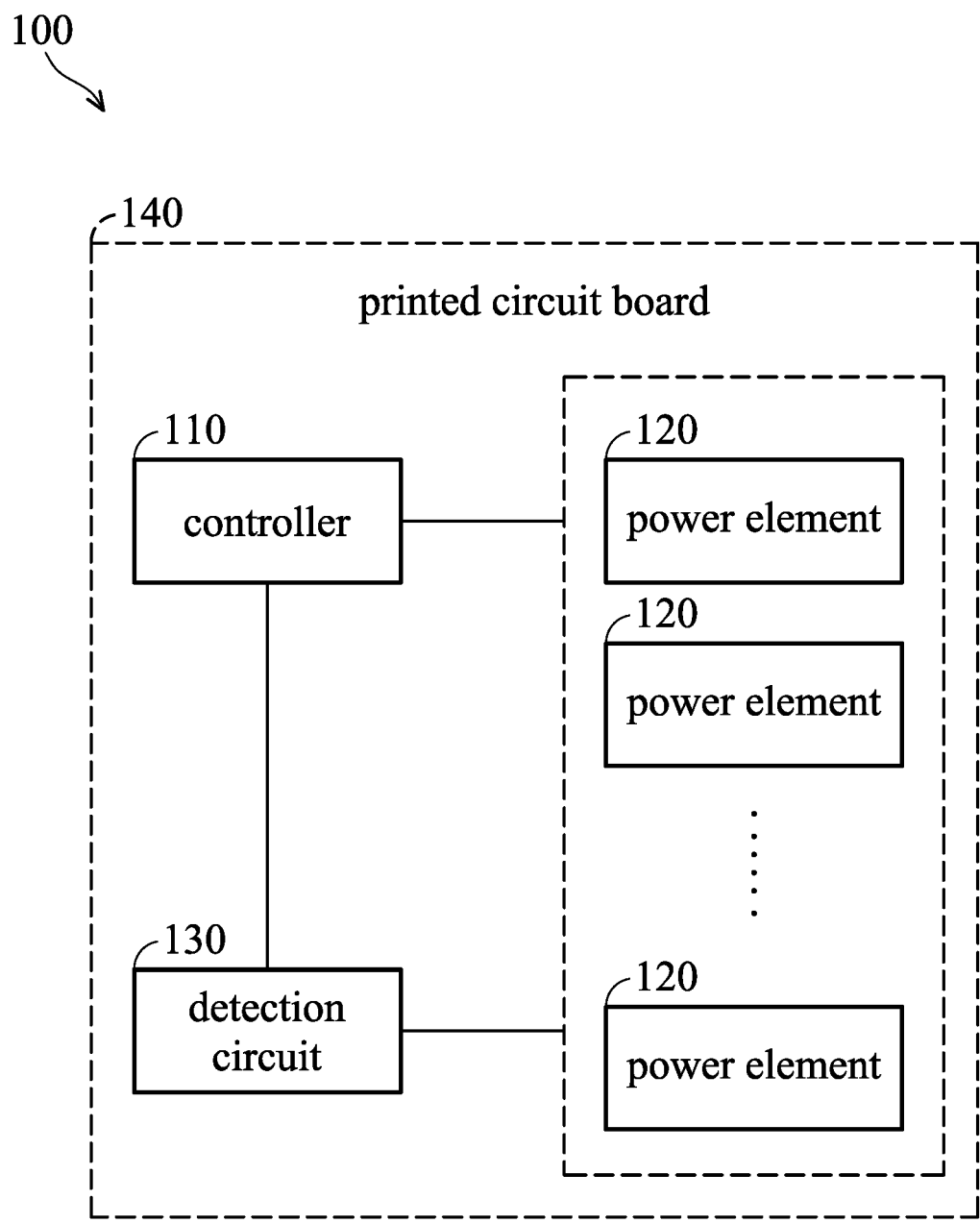
FIG. 1 is a block diagram of an electronic device in accordance with an embodiment of the invention.

FIG. 1 is a block diagram of an electronic device in accordance with an embodiment of the invention. As depicted in FIG. 1, the electronic device 100 includes a controller 110, one or more power elements 120, and one or more detection circuits 130. In some embodiments, the electronic device 100, for example, may be a driver, and the controller 110 may be a general-purpose processor, a digital signal processor (DSP), or a microcontroller, but the invention is not limited thereto.

Each of the power elements 120 may be an insulated gate bipolar transistor (IGBT) module or a capacitor module, but the invention is not limited to the aforementioned components. For example, in addition to the IGBT module and capacitor module, the power elements 120 in the electronic device 100 may include a power rectifier, a power bipolar-junction transistor and thyristor, a power MOSFET, a power integrated circuit (IC), or a combination thereof, but the invention is not limited thereto.

The detection circuits 130 may be detection circuits or sensors of different types that are configured to detect electrical features and/or physical features (e.g., temperature) of different power elements. In some embodiments, the controller 110, the power elements 120, and the detection circuits 130 are disposed on a printed circuit board (PCB) 140, but the invention is not limited thereto.

In an embodiment, a temperature-calculation model M1 corresponding to each power element 120 in the electronic device 100 can be pre-built as the standard for calculating the temperature of each power element 120. For example, the temperature-calculation model M1 may be a thermal network model, a thermal flow equation, a thermal flow simulation or an evaluation result by experimental fitting. The temperature obtained from the temperature-calculation model M1 is defined as a modeled temperature $T_{TCM}$. In addition, the controller 110 may define a parameterized temperature $T_{ref}$ which can be affected by one or more power-element parameters Ref. The parameterized temperature $T_{ref}$ can be obtained by experiments, measurements, simulation, or from a parameterized temperature-calculation model M2 corresponding to the parameterized temperature $T_{ref}$. For purposes of description, the power-element parameter Ref can be regarded as a function of the parameterized temperature $T_{ref}$. For example, the parameterized temperature-calculation model M2 records the following function (or relationship): Ref=$f(T_{Ref})$.

In an embodiment, the input parameters for calculating the temperature-calculation model M1 may be various types of load information. Taking the IGBT module as an example, the load information may include power-element parameters such as environmental temperature, operating voltage, operating current, output frequency, switching frequency, etc., but the invention is not limited thereto. Taking the capacitor module as an example, the load information may include power-element parameters such as environmental temperature, operating voltage, ripple voltage, input current, input power factor, frequency, etc., but the invention is not limited thereto. That is, the controller 110 may use the temperature-calculation model M1 according to various types of load information corresponding to the power element 120 detected by the detection circuits 130 to calculate the modeled temperatures $T_{TCM}$ of the power element.

In an embodiment, the input parameters of the parameterized temperature-calculation model M2, for example, may be one or more non-aging parameters, that is, the power-element parameters Ref that do not change with the use time or number of uses of the electronic component or the power element. Taking the IGBT (e.g. including a gate, a collector, and an emitter) as an example, the gate current $i_g$ of the IGBT in a fixed driving condition is a constant value and does not change with the aging of the IGBT. Accordingly, in the embodiment, the gate current $i_g$ can be used as the input power-element parameters of the parameterized temperature-calculation model M2. In other words, the parameterized temperature-calculation model M2 may record the relationship between the gate current $i_g$ of the IGBT and the parameterized temperature $T_{Ref}$. It indicates that the controller 110 may use the parameterized temperature-calculation model M2 according to the gate current $i_g$ of the IGBT detected by the detection circuit 130 to calculate the parameterized temperature $T_{Ref}$. In addition, taking the capacitor module as an example, since there are multiple capacitors used in the capacitor module, the equivalent series resistance (ESR) of the capacitors may have little change or be completely not affected after usage, and thus the ESR can be regarded as a fixed value. Accordingly, in the embodiment, the ESR can be used as the input power-element parameter of the parameterized temperature-calculation model M2. In other words, the parameterized temperature-calculation model M2 records the relationships between the ESR and the parameterized temperature $T_{Ref}$.

It should be noted that, in the invention, the input parameters or power-element parameters of the parameterized temperature-calculation model M2 may be aging parameters or non-aging parameters as described in the aforementioned embodiment. That is, no matter whether the input parameters or power-element parameters are aging parameters or non-aging parameters, the method provided in the invention is capable of evaluating the temperature of the power element, and the details will be described later.

In an embodiment, the temperature-calculation model M1 can be pre-stored in a non-volatile memory (not shown) of the electronic device 100, such as a read-only memory (ROM). In addition, the parameterized temperature-calculation models M2 corresponding to different parameters are also pre-stored in the non-volatile memory of the electronic device 100. Upon the electronic device 100 being activated, the controller 110 may read out the temperature-calculation model M1 and the parameterized temperature-calculation model M2 from the non-volatile memory before the electronic device 100 is operating. Accordingly, during the operation of the electronic device 100, the controller 110 may utilize the detection circuit 130 to detect the load information corresponding to the power elements 120, and then input the detected load information into the parameterized temperature-calculation model M2 to calculate the parameterized temperature $T_{Ref}$ in real-time.

In an embodiment, when the electronic device 100 is in the initial state, the controller 110 may set up the parameterized temperature $T_{Ref}$ according to different parameters, and the modeled temperature $T_{TCM}$ may be equal to the parameterized temperature $T_{Ref}$. Alternatively, there are slight errors between the modeled temperature $T_{TCM}$ and the parameterized temperature $T_{Ref}$. After the power element 120 has aged due to long-term use, the calculated parameterized temperature $T_{Ref}$ using the parameterized temperature-calculation model M2 under the same load may also change. In response to the difference or variation, at the same time, between the modeled temperature $T_{TCM}$ of a power element 120 calculated by the temperature-calculation model M1 and the parameterized temperature $T_{Ref}$ of the same power element 120 calculated by the parameterized temperature-calculation model M2 being too large, it indicates that the power element 120 under test is about to fail or has failed. Accordingly, the controller 110 may determine whether the power element 120 under test has failed due to aging according to the following equation (1):

$$\left| \frac{T_{TCM} - T_{Ref}}{T_{TCM}} - \varepsilon_0 \right| > \varepsilon_T \quad (1)$$

where $\varepsilon_0$ denotes the initial error between the modeled temperature $T_{TCM}$ and the parameterized temperature $T_{Ref}$, and $\varepsilon_0$ can be regarded as the initial-state-temperature error ratio. $\varepsilon_T$ denotes the permitted-temperature error ratio. In equation (1), the variability of the power-element parameters is uncertain, and the temperature of the power element 120 after aging may be overestimated or underestimated. Thus, the difference in the result of determining the failure of the power element 120 may be positive or negative, and the absolute value is calculated.

In another embodiment, the controller 110 may determine whether the power element 120 under test has failed due to aging according to the variations between different power-element parameters. For example, the power-element parameter(s) of the load information corresponding to the modeled temperature $T_{TCM}$ in the initial state can be defined as the modeled power-element parameter $Ref_{TCM}$. For example, the modeled temperature $T_{Ref}$ can be converted to the modeled power-element parameter $Ref_{TCM}$ using the relationship between the parameters and the temperature of the parameterized temperature $T_{Ref}$, and an error $\varepsilon_0'$ is permitted between the modeled power-element parameter $Ref_{TCM}$ and the measured parameter in the initial state. For example, the initial-state power-element parameter $Ref_{ini}$ may be equal to the power-element parameter Ref. When the power element 120 has aged due to long-term use, the power-element parameter Ref detected by the detection circuit 130, for example, may change to an aged state. When the error between the aged-state power-element parameter $Ref_{ag}$ and the modeled power-element parameter $Ref_{TCM}$ is too larger, it indicates that the power element 120 is about to fail or has failed. Meanwhile, the aged-state power-element parameter $Ref_{ag}$ is similar to the modeled power-element parameter $Ref_{TCM}$. Accordingly, the controller 110 may determine whether the power element 120 under test has failed due to aging according to the following equation (2):

$$\left| \frac{Ref_{TCM} - Ref}{Ref_{TCM}} - \varepsilon_0' \right| > \varepsilon_R \quad (2)$$

where $\varepsilon_0'$ denotes the initial error between the modeled power-element parameter $Ref_{TCM}$ and the actual parameter Ref, and $\varepsilon_R$ denotes the permitted-parameter error ratio. The differences between the embodiment and the aforementioned embodiment are described as follows: (a) the relationship between the modeled temperature and the parameterized temperature should be built in the aforementioned embodiment, and the difference between the modeled temperature and the parameterized temperature, which are obtained using a respective pre-built formula with respect to temperature, is evaluated; (b) the modeled temperature and the parameterized temperature are incorporated together, and the pre-built formula for the modeled power-element parameter is required. The modeled power-element parameter is compared with the actual measured parameter, and the computation complexity can be reduced and the computation speed can be improved.

In the aforementioned embodiments, the advantages the method for determining whether the power element 120 under test has failed includes: (1) the method is capable of determining in real-time whether the temperature of the power element 120 under test is abnormal; (2) it is easy to build the thermal model of the relationship between the temperature and the power-element parameter, and only the relationship of the power-element parameter with respect to the temperature in the initial state has to be established; and (3) the relationship between the corresponding temperature and power-element parameter (e.g., temperature-calculation model M1 and parameterized temperature-calculation model M2) can be established for each power element 120 under test respectively, and it will not cause computation errors due to the differences between respective manufacturing batches, processes, and performances.

Various parameters and their definitions in the invention are provided in Table 1:

TABLE 1

| Parameter | Definition |
|---|---|
| Ls | specific load |
| Ref | power-element parameter (for modeled temperature) |
| $Ref_{TCM}$ | modeled power-element parameter |
| $Ref_{ag}$ | aged-state power-element parameter(s) |
| $Ref_{ini}$ | initial-state power-element parameter(s) |
| $T_{Real\ ag}$ | aged-state real temperature |
| $T_{Real\ ini}$ | initial-state real temperature |
| $T_{Ref}$ | parameterized temperature |
| $T_{Ref\ ag}$ | aged-state parameterized temperature |
| $T_{Ref\ ini}$ | initial-state parameterized temperature |
| $T_{TCM}$ | modeled temperature |
| $T_{TCM\ ag}$ | aged-state parameterized temperature |
| $T_{TCM\ ini}$ | initial-state parameterized temperature |
| $T_{TCM\ adj}$ | adjusted modeled temperature |
| $T_{Vis\_ag}$ | aged-state parameterized temperature (obtained from a non-aging model) |
| $\varepsilon_0$ | initial-state-temperature error ratio |
| $\varepsilon_R$ | permitted-parameter error ratio |
| $\varepsilon_T$ | permitted-temperature error ratio |

In the first embodiment of the invention, the parameter Ref of the parameterized temperature $T_{REF}$ is a single variable, and the parameter Ref is not an aging parameter.

Upon the electronic device 100 being activated, the controller 110 may read out the temperature-calculation model M1 and the parameterized temperature-calculation model M2 from the non-volatile memory before the electronic device 100 is operating. Accordingly, during the operation of the electronic device 100, the controller 110 may utilize the detection circuit 130 to detect the load information corresponding to the power element 120, and then input the detected load information respectively into the temperature-calculation model M1 and the parameterized temperature-calculation model M2 to calculate in real-time the modeled temperature $T_{TCM}$ and the parameterized temperature $T_{Ref}$.

When the electronic device 100 is in the initial state, an error $\varepsilon_0$ is allowed between the modeled temperature $T_{TCM}$ and the parameterized temperature $T_{Ref}$, and the error $\varepsilon_0$ can be regarded as the initial-state-temperature error ratio. When the power element 120 has aged due to long-term use, the calculated modeled temperature $T_{TCM}$ using the temperature-calculation model M1 under the same load remains the same, however, the calculated parameterized temperature $T_{Ref}$ using the parameterized temperature-calculation model M2 under the same load may change. That is, the difference between the modeled temperature $T_{TCM}$ and the parameterized temperature $T_{Ref}$ may become larger. Accordingly, if the permitted-temperature error ratio $\varepsilon_T$ is used to determine whether the power element has failed due to aging, the initial error $\varepsilon_0$ between the modeled temperature $T_{TCM}$ and the parameterized temperature $T_{Ref}$ should be considered. If the temperature error ratio between the modeled temperature $T_{TCM}$ and the parameterized temperature $T_{Ref}$ exceeds the permitted-temperature error ratio $\varepsilon_T$, the controller 110 may determine that the power element 120 has failed due to aging.

Figures 2A, 2B:
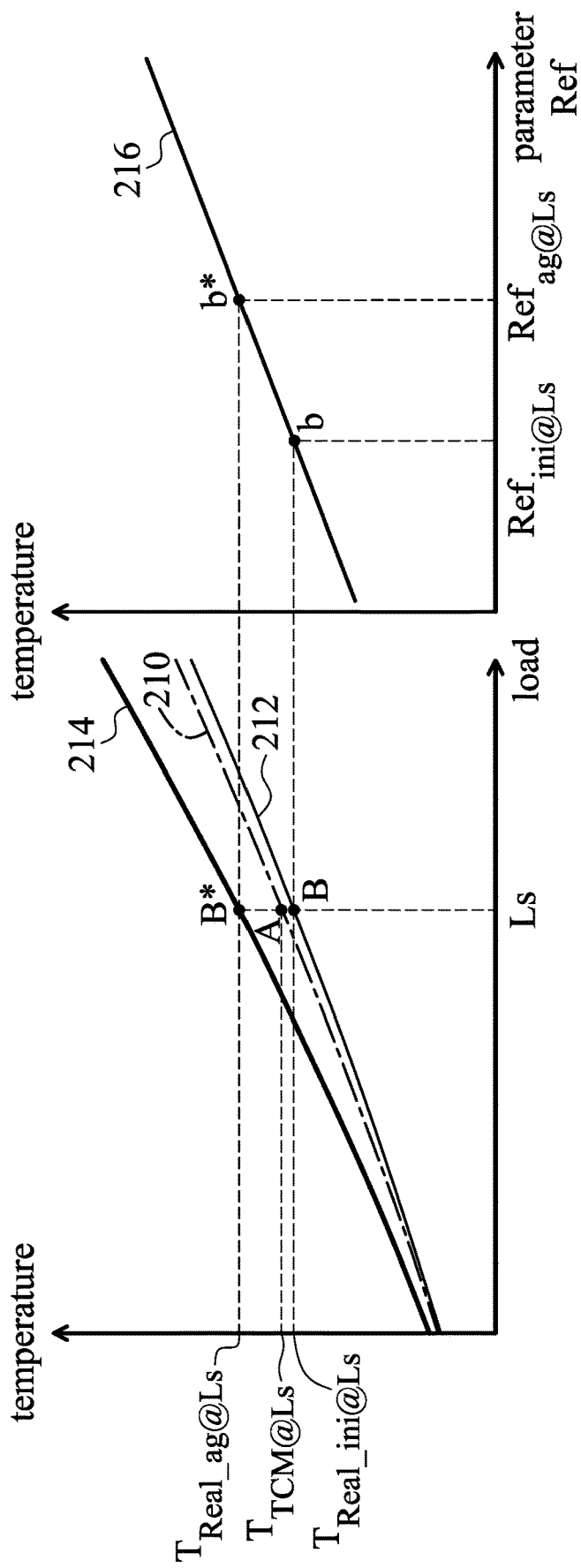
FIG. 2A is a diagram of the relationship between the load information and temperature in accordance with the first aspect of the invention.
FIG. 2B is a diagram of the relationship between the power-element parameter and temperature in accordance with the first aspect of the invention.

FIG. 2A is a diagram of the relationship between the load information and temperature in accordance with the first aspect of the invention. FIG. 2B is a diagram of the relationship between the power-element parameter and temperature in accordance with the first aspect of the invention.

Referring both FIG. 2A and FIG. 2B, $T_{real}$ denotes the initial-state real temperature in FIG. 2A. Curve 210 denotes the relationship curve between the modeled temperature $T_{TCM}$ and load information of the power element 120 in the initial state. Curve 212 denotes the relationship curve between the real temperature and load information of the power element 120 in the initial state. For example, given that a specific load Ls is used, temperatures $T_{TCM@Ls}$ and $T_{Real\_ini@Ls}$ can be respectively obtained from curves 210 and 212, and there is difference between the two obtained temperatures. Curve 216 in FIG. 2B denotes the relationship curve between the power-element parameter and temperature. Specifically, given that the specific load Ls is used, the initial-state real temperature $T_{Real\_ini@Ls}$ can be obtained from curve 212 in FIG. 2A, and the initial-state power-element parameter $Ref_{ini@Ls}$ can be obtained from curve 216 in FIG. 2B using the initial-state real temperature $T_{Real\_ini@Ls}$.

When the power element 120 has aged due to long-term use, the real temperature of the power element 120 under the same load will change. For example, under the same specific load Ls, the real temperature of the power element 120 may move from point B to point B*. That is, curve 212 in FIG. 2A is changed to curve 214, and the real temperature of the power element 120 may change from the initial-state real temperature $T_{Real\_ini@Ls}$ to the aged-state real temperature $T_{Real\_ag@Ls}$. Meanwhile, referring to curve 216 in FIG. 2B, the temperature point will move from point b to point b*. That is, the corresponding parameter Ref will change from the initial-state power-element parameter $Ref_{ini@Ls}$ to the aged-state power-element parameter $Ref_{ag@Ls}$.

Since the modeled temperature $T_{TCM}$ is determined by the load, no matter whether the power element 120 has aged, the temperature result obtained from the temperature-calculation model M1 is fixed at the temperature $T_{TCM@Ls}$ of point A in FIG. 2A. However, the parameterized temperature will change as the power element 120 ages. For example, point b changes to point b* on curve 216. Specifically, as the degree of aging of the power element 120 becomes more and more serious, the error between the modeled temperature $T_{TCM}$ and the parameterized temperature $T_{Ref}$ will become larger and larger under the same specific load $L_s$. Accordingly, the controller 110 may set the permitted-temperature error ratio $\varepsilon_T$, and the initial error $\varepsilon_0$ between the modeled temperature $T_{TCM}$ and the parameterized $T_{Ref}$ should be considered. In response to the temperature error ratio between the modeled temperature $T_{TCM}$ and the parameterized $T_{Ref}$ exceeding the permitted-temperature error ratio $\varepsilon_T$, the controller 110 may determine that the power element 120 has failed due to aging according to equation (1).

In another embodiment, the controller 110 may determine whether the power element 120 has failed due to aging based on the variation of the parameter, such as determining whether the power element 120 has failed due to aging according to equation (2). For example, temperature $T_{TCM@Ls}$ in FIG. 2A corresponds to the fixed power-element parameter $Ref_{ini@Ls}$ on curve 216 in FIG. 2B. As the power element 120 ages, the parameter will move from point b to point b* on curve 216. That is, the power-element parameter is changed to $Ref_{ag@Ls}$. Accordingly, the controller 110 may define the permitted-temperature error ratio $\varepsilon_R$, and determine whether the power element 120 has failed due to aging using equation (2).

Figure 3A:
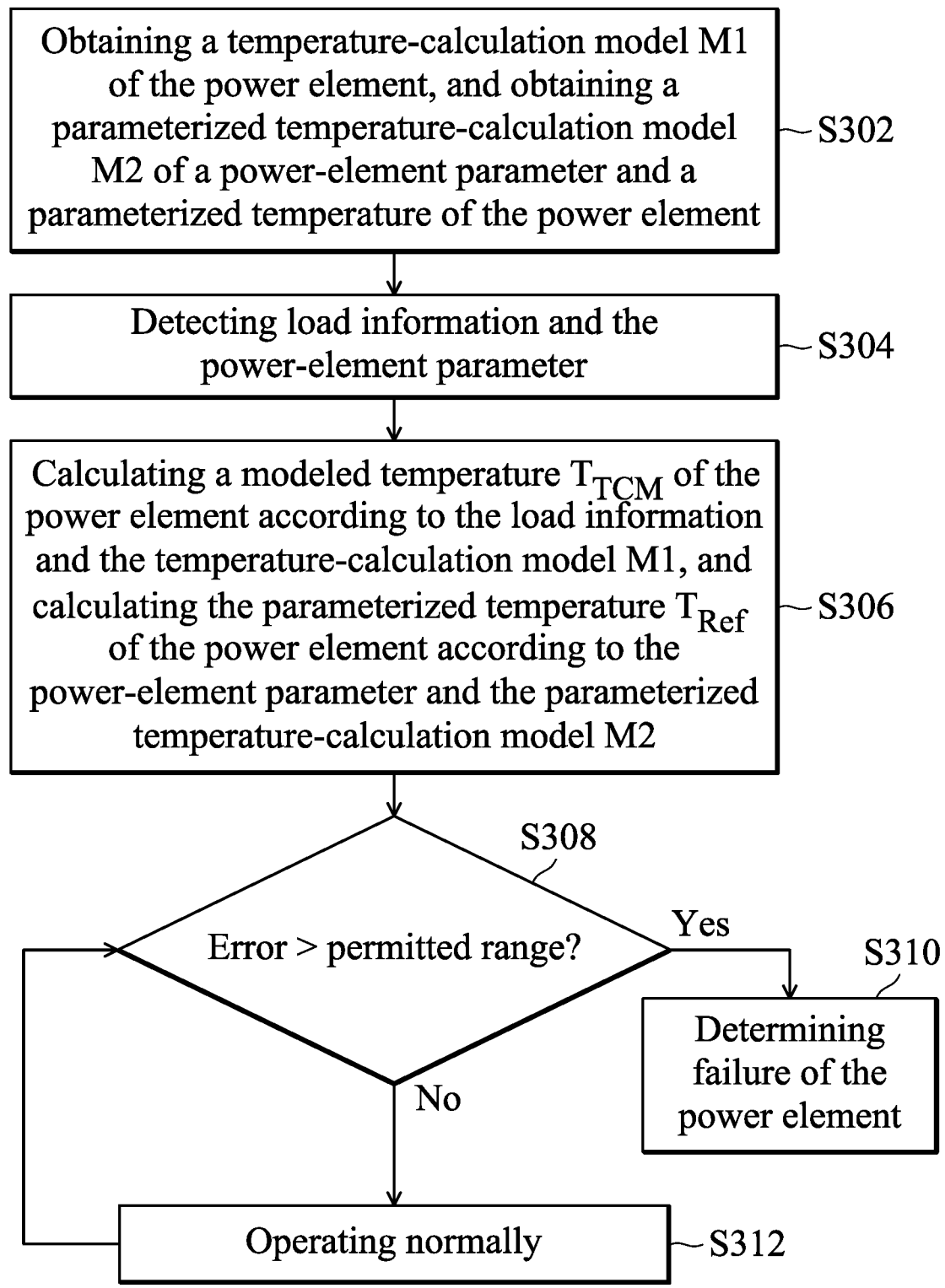
FIG. 3A is a flow chart of a method for determining failure of a power element in accordance with an embodiment of the first aspect of the invention.

FIG. 3A is a flow chart of a method for determining failure of a power element in accordance with an embodiment of the first aspect of the invention.

Referring to FIG. 1 and FIG. 3A, in step S302, the temperature-calculation model M1 of a power element 120 under test in the electronic device 100 is obtained, and a parameterized temperature-calculation model M2 between the power-element parameter and the temperature of the power element 120 under test is obtained. For example, the temperature-calculation model M1 and the parameterized temperature-calculation model M2 can be pre-stored in a non-volatile memory (not shown in FIG. 1) of the electronic device 100. Upon the electronic device 100 being activated, the controller 110 may read out the temperature-calculation model M1 and the parameterized temperature-calculation model M2 from the non-volatile memory before the electronic device 100 is operating. Accordingly, during the operation of the electronic device 100, the controller 110 may utilize the detection circuit 130 to detect the load information corresponding to the power element 120, and then input the detected load information into the parameterized temperature-calculation model M2 to calculate the parameterized temperature $T_{Ref}$ in real-time.

In step S304, the load information and power-element parameter of the power element 120 under test are detected. In some embodiments, the load information may include the power-element parameter. It should be noted that the load information and power-element parameters of different power elements may be different, and the detection circuits 130 are designed for various of power elements, thereby detecting the load information and power-element parameters Ref corresponding to different power elements.

In step S306, a modeled temperature $T_{TCM}$ of the power element 120 under test is calculated according to the load information and the temperature-calculation model M1, and a parameterized temperature $T_{Ref}$ of the power element 120 under test is calculated according to the power-element parameter and the parameterized temperature-calculation model M2. During the operation of the electronic device 100, the controller 110 may utilize the detection circuit 130 to detect the load information corresponding to the power element 120, and then input the detected load information respectively into the temperature-calculation model M1 and the parameterized temperature-calculation model M2 to calculate the modeled temperature $T_{TCM}$ and the parameterized temperature $T_{Ref}$ in real-time.

In step S308, it is determined whether the error between the modeled temperature $T_{TCM}$ and the parameterized temperature $T_{Ref}$ exceeds the permitted range. For example, the permitted range may be the permitted-temperature error ratio $\varepsilon_T$ set by the controller 110, and the controller 110 may perform the determination according to equation (1).

If the error between the modeled temperature $T_{TCM}$ and the parameterized temperature $T_{Ref}$ exceeds the permitted range, the controller 110 may determine that the power element 120 has failed (step S310), and perform the subsequent shutdown procedure to facilitate replacement of the power element 120.

If the error between the modeled temperature $T_{TCM}$ and the parameterized temperature $T_{Ref}$ does not exceed the permitted range, the controller 110 may control the electronic device 100 to operate normally (step S312), and the flow goes back to step S308 to keep determining whether the error between the modeled temperature $T_{TCM}$ and the parameterized temperature $T_{Ref}$ exceeds the permitted range.

Specifically, in the flow of FIG. 3A, the controller 110 performs the determination according to the temperature.

Figure 3B:
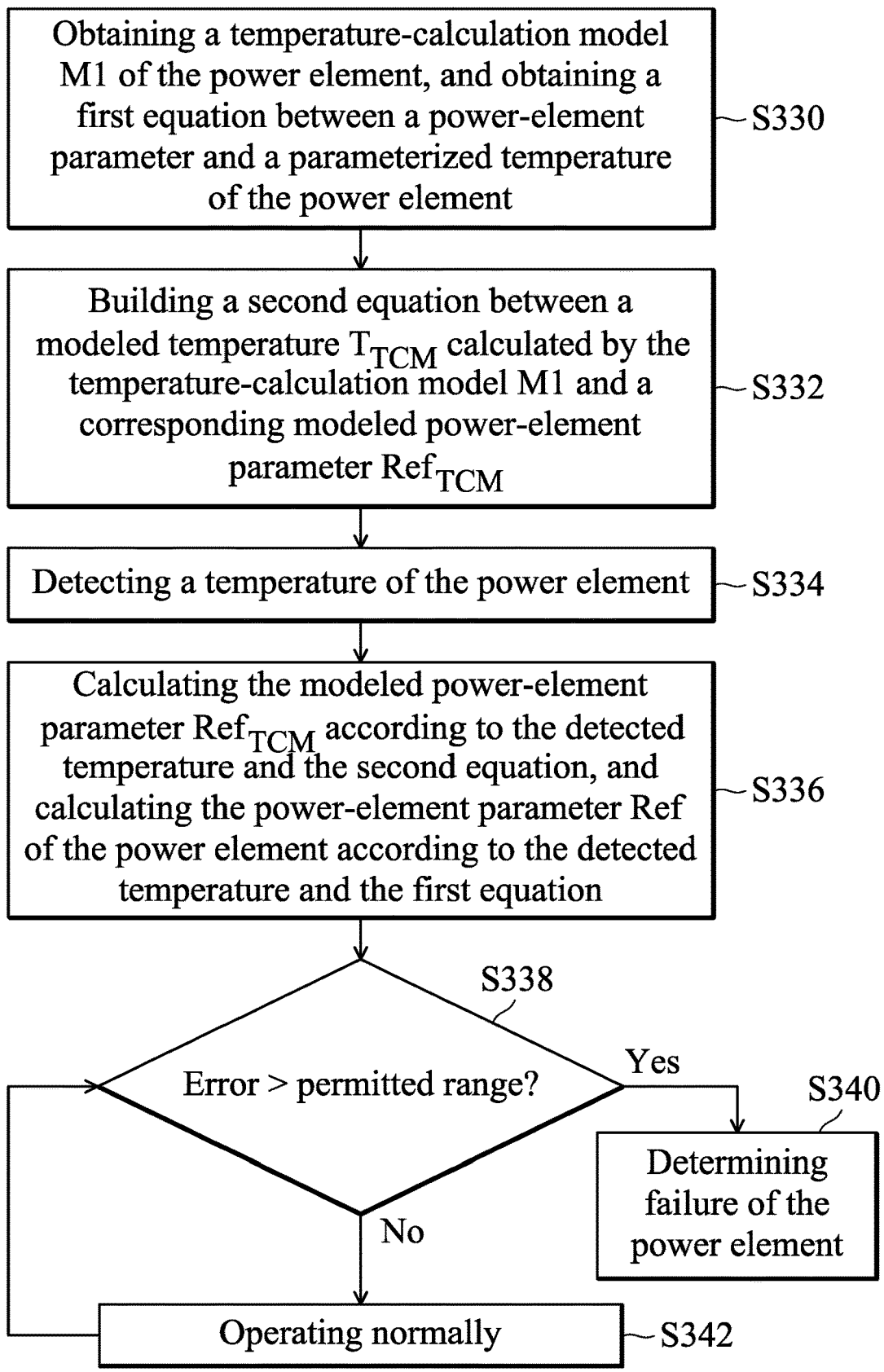
FIG. 3B is a flow chart of a method for determining failure of a power element in accordance with another embodiment of the first aspect of the invention.

FIG. 3B is a flow chart of a method for determining failure of a power element in accordance with another embodiment of the first aspect of the invention.

Referring to FIG. 1 and FIG. 3B, in step S330, the temperature-calculation model M1 of a power element 120 under test in the electronic device 100 is obtained, and an equation (e.g., the first equation) between the power-element parameter and the modeled temperature of the power element 120 under test is obtained. For example, the power-element parameter Ref can be regarded as a function of the parameterized temperature $T_{Ref}$, such as Ref=$f(T_{Ref})$.

In step S332, another equation (e.g., the second equation) between the modeled temperature $T_{TCM}$ and the corresponding modeled power-element parameter $Ref_{TCM}$ is built according to the temperature-calculation model M1. Then, the modeled temperature $T_{TCM}$ is converted to the modeled power-element parameter $Ref_{TCM}$ using the relationship between the power-element parameter and the parameterized temperature $T_{Ref}$, such as $Ref_{TCM}=f(T_{TCM})$, wherein the modeled power-element parameter $Ref_{TCM}$ corresponding to the modeled temperature $T_{TCM}$ may be the input load information of the temperature-calculation model M1.

In step S334, the detection circuit 130 detects the parameter of the power element 120 under test. The difference between FIG. 3A and FIG. 3B is that the parameter Ref in step S334 can be directly used to compare with the modeled power-element parameter $Ref_{TCM}$, and the flow for converting the parameter Ref to the temperature in FIG. 3A is not required.

In step S336, the modeled power-element parameter $Ref_{TCM}$ of the power element 120 under test is calculated according to the detected temperature and the second equation, and the power-element parameter Ref of the power element 120 under test is calculated according to the detected temperature and the first equation. During the operation of the electronic device 100, the controller 110 may use the detection circuit 130 to detect the temperature of the power element 120 in real-time, and then the detected temperature is input respectively to the second equation and the first equation to calculate the modeled power-element parameter $Ref_{TCM}$ and the power-element parameter Ref.

In step S338, it is determined whether the error between the modeled power-element parameter $Ref_{TCM}$ and the power-element parameter Ref exceeds the permitted range.

For example, the permitted range may be the permitted-parameter error ratio $\varepsilon_R$ set by the controller 110, and the controller 110 performs the determination according to equation (2).

If the error between the modeled power-element parameter $Ref_{TCM}$ and the power-element parameter Ref exceeds the permitted range, the controller 110 may determine that the power element 120 has failed (step S340), and perform the subsequent shutdown procedure to facilitate replacement of the power element 120.

If the error between the modeled power-element parameter $Ref_{TCM}$ and the power-element parameter Ref does not exceed the permitted range, the controller 110 controls the electronic device 100 to operate normally (step S342), and the flow goes back to step S338 to keep determining whether the error between the modeled power-element parameter $Ref_{TCM}$ and the power-element parameter Ref exceeds the permitted range.

Specifically, in the flow of FIG. 3B, the controller performs the determination according to the power-element parameter.

The second aspect of the invention is based on the aforementioned first aspect. In the second aspect of the invention, the result of the parameterized temperature $T_{Ref}$ can be used to calibrate the temperature-calculation model M1, or calibrate the temperature-calculation model of other similar power elements. With regard to the parameterized temperature $T_{Ref}$, the power-element parameter Ref of the power element 120 has to be detected in real-time to calculate the parameterized temperature $T_{Ref}$. However, a complicated detection circuit 130 is usually deployed in the electronic device 100 to detect the power-element parameter Ref. If multiple detection circuits are deployed in the electronic device 100, it may increase the cost, size, and system complexity of the electronic device 100.

Accordingly, in the second aspect of the invention, the temperature-calculation model M1 can be used to evaluate the temperature of multiple power elements, and the number of power-element parameters required to calculate the parameterized temperature is just 1. For example, the controller 110 may use the parameterized temperature $T_{Ref}$ to calibrate the temperature-calculation model M1, and evaluate the damage statuses of multiple power elements 120, thereby calibrating the damage status of each power element 120 as well as achieving the effect of detecting of the multiple power elements 120 in real-time.

Figures 4A, 4B:
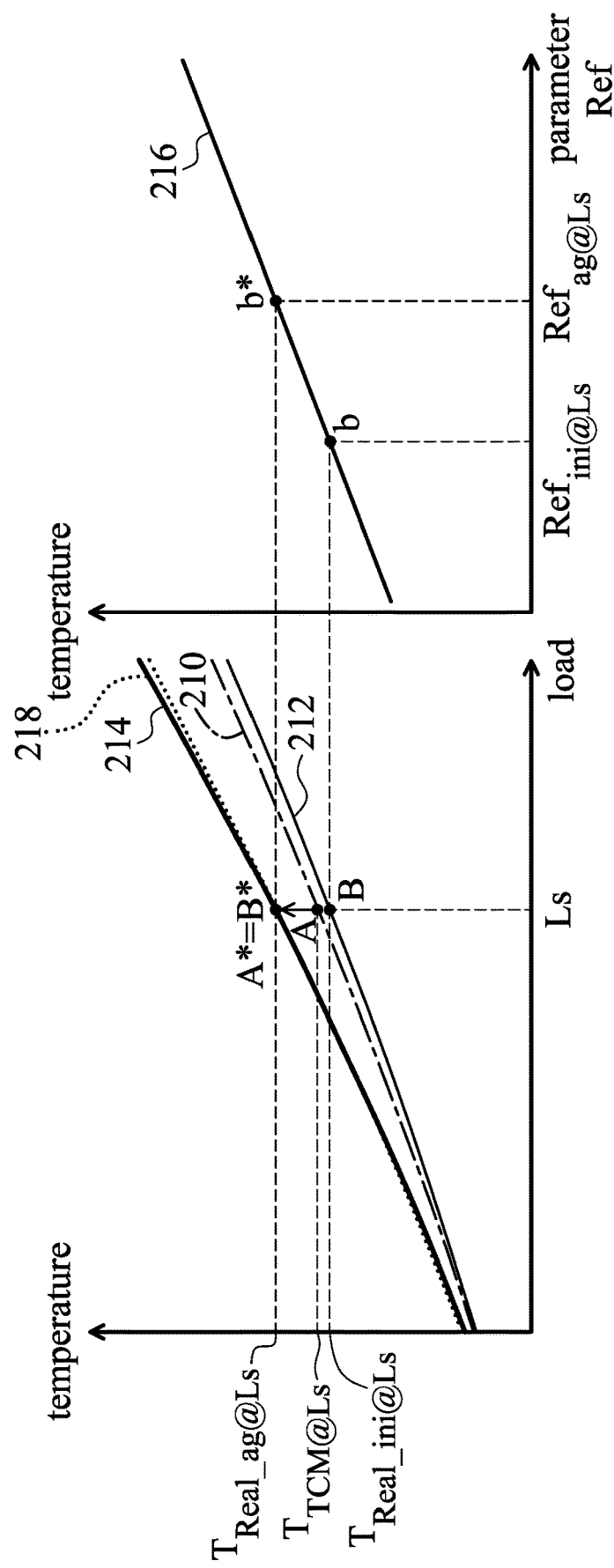
FIG. 4A is a diagram of the relationship between the load information and temperature in accordance with the second aspect of the invention.
FIG. 4B is a diagram of the relationship between the power-element parameter and temperature in accordance with the second aspect of the invention.

FIG. 4A is a diagram of the relationship between the load information and temperature in accordance with the second aspect of the invention. FIG. 4B is a diagram of the relationship between the power-element parameter and temperature in accordance with the second aspect of the invention.

FIG. 4A is similar to FIG. 2A, and the difference between FIG. 4A and FIG. 2A is that another curve 218 for calibrating the temperature-calculation model has been added into FIG. 4A.

Specifically, when the power element 120 has aged due to long-term use, the real temperature of the power element 120 under the same load may change. For example, the real temperature of the power element 120 may change from point B to point B* under the same specific load Ls. That is, curve 212 is changed to curve 214, and the real temperature of the power element 120 may change from the initial-state real temperature $T_{Real\_ini@Ls}$ to the aged-state real temperature $T_{Real\_ag@Ls}$. Meanwhile, referring to curve 216 in FIG. 4B, the temperature point is changed from point b to point b*. That is, the corresponding parameter is changed from the initial-state power-element parameter $\text{Ref}_{ini@Ls}$ to the aged-state power-element parameter $\text{Ref}_{ag@Ls}$.

Since the modeled temperature $T_{TCM}$ is determined by the load, no matter whether the power element 120 has aged or not, the result obtained from the temperature-calculation model M1 under the same specific load $L_s$ is fixed to the modeled temperature $T_{TCM@Ls}$ corresponding to point A in FIG. 2A. However, in the second aspect of the invention, the parameterized temperature $T_{Ref}$ can be used to calibrate the temperature-calculation model M1. For example, given the same specific load Ls, the controller 110 may calibrate point A to point A* in FIG. 4A, where point A* and point B* are the same. Specifically, the temperature-calculation model M1 corresponds to curve 210 in FIG. 4A, but the calibrated temperature-calculation model corresponds to curve 218 in FIG. 4A.

The parameterized temperature may vary due to aging of the power element 120, such as changing from point b to point b* on curve 216. Specifically, as the degree of the aging of the power element 120 becomes more and more serious, the error between the modeled temperature $T_{TCM}$ and the parameterized temperature $T_{Ref}$ under the same specific load Ls may also become larger and larger. However, in the second aspect of the invention, the parameterized temperature $T_{Ref}$ can be used to calibrate the temperature-calculation model M1. That is, after the power element 120 has aged, curve 210 can be calibrated to curve 218 by looking up the table built using the damage or experimental data.

For example, if the power element 120 in the electronic device 100 includes multiple chips of the same type, the controller 110 may use the power-element parameter that was detected in real-time to calculate the parameterized temperature $T_{Ref}$, and calibrate the temperature-calculation model M1 of one of the chips using the parameterized temperature $T_{Ref}$. In addition, the controller 110 may use the relationship between the chip damage and temperature to calibrate the temperature-calculation model of other chips. Thus, the controller 110 may obtain the current aging status of other chips, thereby performing element protection. That is, calibrating the temperature-calculation model using the second aspect of the invention may also provide protection from overheating.

Figure 5:
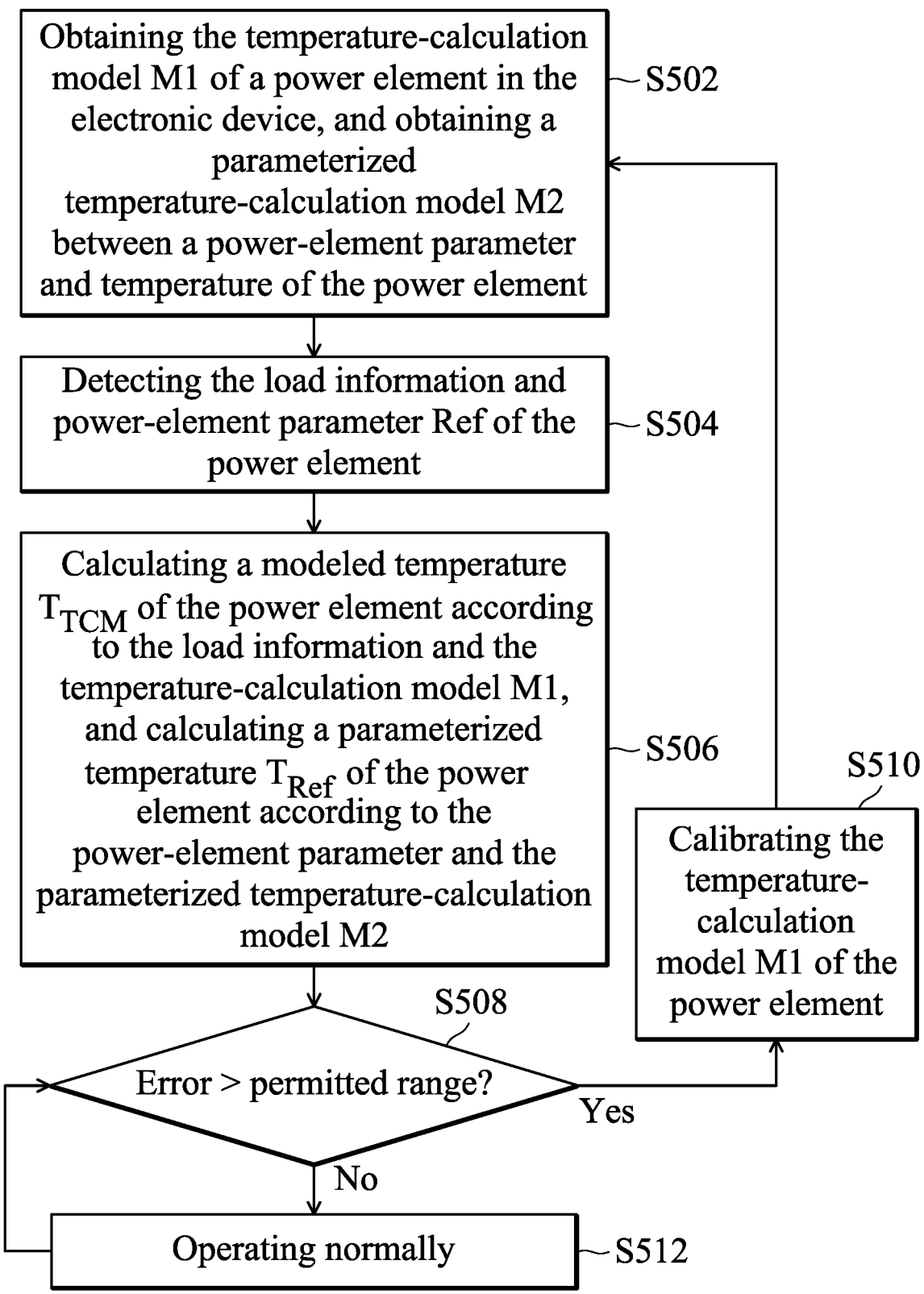
FIG. 5 is a flow chart of a method for determining failure of a power element in accordance with an embodiment of the first aspect of the invention.

FIG. 5 is a flow chart of a method for determining failure of a power element in accordance with an embodiment of the first aspect of the invention.

Referring to FIG. 1 and FIG. 5, in step S502, the temperature-calculation model M1 of a power element 120 under test in the electronic device 100 is obtained, and a parameterized temperature-calculation model M2 between the power-element parameter and the temperature of the power element 120 under test is obtained. For example, the temperature-calculation model M1 and the parameterized temperature-calculation model M2 can be pre-stored in a non-volatile memory (not shown in FIG. 1) of the electronic device 100. Upon the electronic device 100 being activated, the controller 110 may read out the temperature-calculation model M1 and the parameterized temperature-calculation model M2 from the non-volatile memory before the electronic device 100 is operating. Accordingly, during the operation of the electronic device 100, the controller 110 may utilize the detection circuit 130 to detect the load information corresponding to the power element 120, and then input the detected load information into the parameterized temperature-calculation model M2 to calculate the parameterized temperature $T_{Ref}$ in real-time.

In step S504, the load information and power-element parameter of the power-element 120 under test are detected. In some embodiments, the load information may include the power-element parameter. It should be noted that different power elements may have different load information and power-element parameters, and the detection circuits 130 are designed for various of power elements, thereby detecting the load information and power-element parameters Ref corresponding to different power elements.

In step S506, a modeled temperature $T_{TCM}$ of the power element 120 under test is calculated according to the load information and the temperature-calculation model M1, and a parameterized temperature $T_{Ref}$ of the power element 120 under test is calculated according to the power-element parameter and the parameterized temperature-calculation model M2. During the operation of the electronic device 100, the controller 110 may utilize the detection circuit 130 to detect the load information corresponding to the power element 120, and then input the detected load information respectively into the temperature-calculation model M1 and the parameterized temperature-calculation model M2 to calculate the modeled temperature $T_{TCM}$ and the parameterized temperature $T_{Ref}$ in real-time.

In step S508, it is determined whether the error between the modeled temperature $T_{TCM}$ and the parameterized temperature $T_{Ref}$ exceeds the permitted range. For example, the permitted range may be the permitted-temperature error ratio $\varepsilon_T$ set by the controller 110, and the controller 110 may perform the determination according to equation (1).

If the error between the modeled temperature $T_{TCM}$ and the parameterized temperature $T_{Ref}$ exceeds the permitted range, the controller 110 may calibrate the temperature-calculation model M1 of the power element 120 under test according to the parameterized temperature $T_{Ref}$ (step S510), and then step S502 is performed. It should be noted that, in the first aspect of the invention, in response to the determination result of step S308 in FIG. 3A indicating "Yes", the controller 110 directly determines that the power element 120 under test has failed. However, in the second aspect of the invention, in response to the determination result of step S508 in FIG. 5 indicating "Yes", the controller 110 calibrates the temperature-calculation model M1 of the power element 120 under test.

If the error between the modeled temperature $T_{TCM}$ and the parameterized temperature $T_{Ref}$ does not exceed the permitted range, the controller 110 may control the electronic device 100 to operate normally (step S512), and the flow goes back to step S508 to keep determining whether the error between the modeled temperature $T_{TCM}$ and the parameterized temperature $T_{Ref}$ exceeds the permitted range.

The third aspect of the invention is based on the aforementioned first aspect. The third aspect of the invention is not limited by whether the power-element parameter Ref is an aging parameter or a non-aging parameter, and the parameterized temperature $T_{Ref}$ is obtained from the temperature-calculation model M1. For example, in the third aspect of the invention, when the electronic device 100 is in the initial state, the controller 110 may read out the temperature-calculation model M1. Since the parameterized temperature $T_{Ref}$ is calculated by the temperature-calculation model M1, it is not necessary to obtain the power-element parameter Ref corresponding to the parameterized temperature $T_{Ref}$ in advance. The primary difference between the third and first aspects of the invention is that, in the third aspect of the invention, the power-element parameter Ref and its corresponding real temperature may both change under the same load no matter whether the power element 120 has aged. Accordingly, the controller 110 is capable of determining whether the power element 120 has aged or not without knowing the correct parameterized temperature $T_{Ref}$ of the aged power element 120. However, the aged state of the power element 120 in the third aspect of the invention is a relative value rather than an absolute value as described in the embodiments of the first aspect of the invention.

In the third aspect of the invention, the power-element parameter Ref corresponding to the parameterized temperature $T_{Ref}$ is a single variable, and the parameterized temperature $T_{Ref}$ may be affected or not affected by the aging of the power element 120. In addition, the parameterized temperature $T_{Ref}$ and the power-element parameter Ref are obtained from the temperature-calculation model M1. For example, the controller 110 may use the relationship between the temperature-calculation model M1 and the power-element parameter Ref to derive the parameterized temperature $T_{Ref}$ and the relationship between the temperature-calculation model M1 and the power-element parameter Ref.

Because the detection circuit 130 is capable of detecting the load information and the power-element parameter Ref in real-time, the controller 110 may use the relationship between the parameterized temperature $T_{Ref}$, the temperature-calculation model M1 and the power-element parameter Ref to calculate the parameterized temperature $T_{Ref}$. In addition, the controller 110 may also calculate the modeled temperature $T_{TCM}$ according to the load information and the temperature-calculation model M1.

When the electronic device 100 is in the initial state, the parameterized temperature $T_{Ref}$ is determined by the temperature-calculation model M1, and thus the parameterized temperature $T_{Ref}$ is equal to the modeled temperature $T_{TCM}$ in the initial state. When the power element 120 has aged, the modeled temperature $T_{TCM}$ obtained from the temperature-calculation model M1 under the same specific load is the same as that in the initial state. However, the parameterized temperature $T_{Ref}$ may vary depending on the age of the power element 120, and the corresponding power-element parameter Ref may also change, resulting in a greater error between the modeled temperature $T_{TCM}$ and the parameterized temperature $T_{Ref}$. Accordingly, the controller 110 may set the permitted-temperature error ratio $\varepsilon_T$, and the controller 110 may determine that the power element 120 has failed in response to the error between the modeled temperature $T_{TCM}$ and the parameterized temperature $T_{Ref}$ exceeding the permitted-temperature error ratio $\varepsilon_T$.

The advantages of the third aspect of the invention are that measuring the curves of the parameterized temperature in advance or considering whether the power element 120 has aged or not are unnecessary. Specifically, the method in the third aspect of the invention is to build the relationship between the power-element parameter and temperature for each corresponding power element 120, and the temperature of the aged power element 120 is a relative value. The controller 110 may determine whether the power element 120 has aged using the temperature error or parameter error. However, the standard for determining failure of the aged power element 120 should be further confirmed using post experiments.

Figures 6A, 6B:
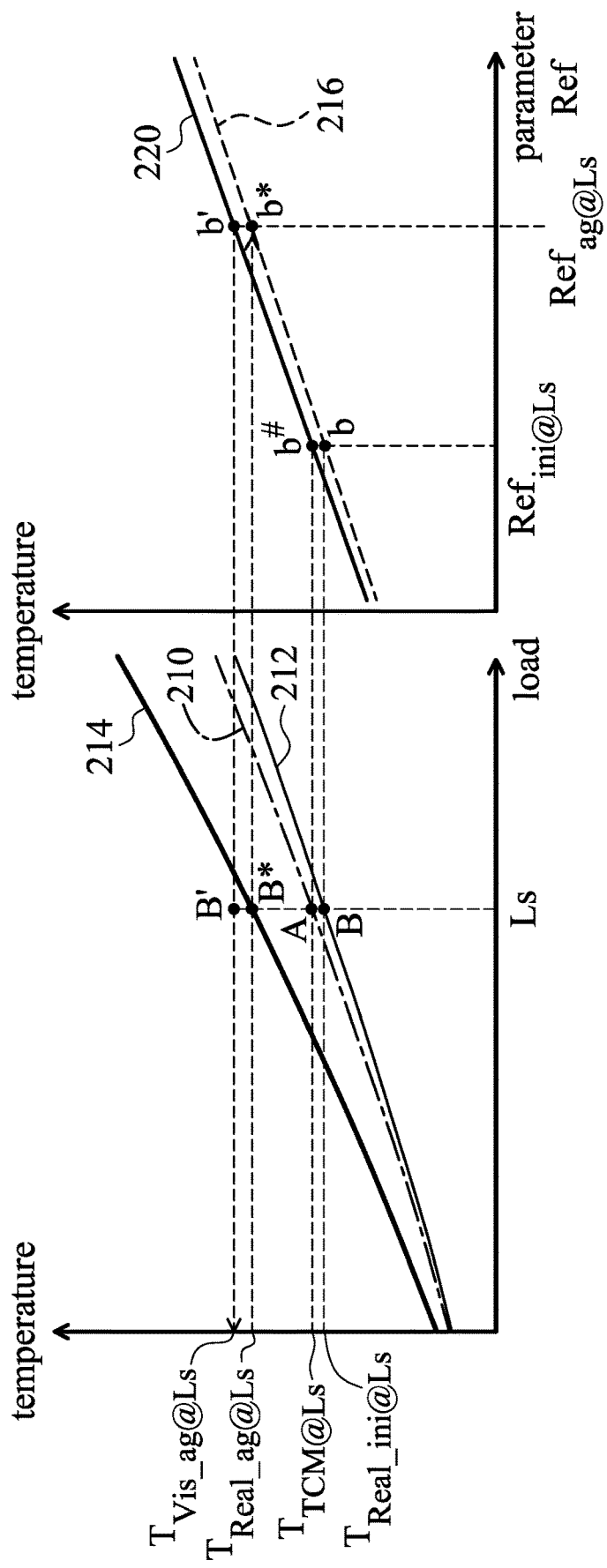
FIG. 6A is a diagram of the relationship between the load information and temperature in accordance with an embodiment in the third aspect of the invention.
FIG. 6B is a diagram of the relationship between the power-element parameter and temperature in accordance with an embodiment in the third aspect of the invention.

FIG. 6A is a diagram of the relationship between the load information and temperature in accordance with an embodiment in the third aspect of the invention. FIG. 6B is a diagram of the relationship between the power-element parameter and temperature in accordance with an embodiment in the third aspect of the invention.

In order to facilitate the description of the third aspect of the present invention, the first aspect of the invention is extended to describe the third aspect of the invention in FIGS. 6A and 6B, such as the parameterized temperature $T_{Ref}$ not being affected by the aging of the power element 120. As depicted in FIG. 6A, when the power element 120 is in the initial state and under the specific load Ls, the detection circuit 130 may directly measure the real temperature $T_{Real\_ini@Ls}$ of the power element 120. If the temperature-calculation model M1 and the specific load Ls are used, the modeled temperature $T_{TCM@Ls}$ can be calculated, and an error is allowed between the modeled temperature $T_{TCM@Ls}$ and the real temperature $T_{Real\_ini@Ls}$. With regard to the parameterized temperature, if the method described in the embodiment in the first aspect of the invention is used, the parameterized temperature-calculation model M2 corresponds to curve 216. However, in the third aspect of the invention, the parameterized temperature is calculated using the temperature-calculation model M1. That is, the power-element parameter $Ref_{ini@Ls}$ that originally corresponds to the initial-state real temperature $T_{Real\_ini@Ls}$ on curve 216, will correspond to the modeled temperature $T_{TCM@Ls}$, such as changing from point b to point b#. Accordingly, the relationship between the parameterized temperature and the power-element parameter in the initial state can be expressed by another curve 220 in FIG. 6B.

When the power element 120 has aged due to long-term use, the temperature of the power element 120 will change, such as changing from the initial-state real temperature $T_{Real\_ini}$ to the aged-state real temperature $T_{Real\_ag}$. Accordingly, under the same specific load Ls, the temperature of the power element 120 may change from the initial-state real temperature $T_{Real\_ini}$ to the aged-state real temperature $T_{Real\_ag}$, such as changing from point B to point B*, as depicted in FIG. 6A. Referring to FIG. 6B, the corresponding temperature may change from point b to point b* using the curve 216 of the power-element parameter with respect to the temperature, that is, the corresponding power-element parameter may change from the initial-state power-element parameter $Ref_{ini@Ls}$ to the aged-state power-element parameter $Ref_{ag@Ls}$. However, the modeled temperature $T_{TCM}$ is determined by the load information, and no matter whether the power element 120 has aged or not, the modeled temperature $T_{TCM}$ calculated from the temperature-calculation model M1 is the same as the modeled temperature $T_{TCM}$ in the initial state (i.e., both at point A).

However, the parameterized temperature $T_{Ref}$ may change in response to the age of the power element 120, and the aged power element 120 may have a corresponding power-element parameter $Ref_{ag@Ls}$ and real temperature $T_{Real\_ag@Ls}$. It should be noted that the parameterized temperature $T_{Ref}$ is based on curve 220, and thus, in the condition of the same aged-state power-element parameter $Ref_{ag@Ls}$, the real temperature of the power element 120 may change from point b* to point b'. That is, after obtaining the looking-up result using the parameterized temperature (e.g., looking up the real temperature of the power element 120 using the curve 220), it can be understood that the real temperature of the power element 120 may change from the aged-state real temperature $T_{Real\_ag@Ls}$ to aged-state parameterized temperature $T_{Vis\_ag@Ls}$.

Briefly, in the third aspect of the invention, the modeled temperature $T_{TCM}$ and the parameterized temperature $T_{Ref}$ calculated from the temperature-calculation model M1 under the specific load Ls in the initial state are the same. However, after the power element 120 has aged, the modeled temperature $T_{TCM}$ calculated from the temperature-calculation model M1 remains the same, but the parameterized temperature $T_{Ref}$ of the aged power element 120 may change from point b # to point b'. That is, the power-element parameter may change from the initial-state power-element parameter $Ref_{ini@Ls}$ to aged-state power-element parameter $Ref_{ag@Ls}$, and the parameterized temperature $T_{Ref}$ may change from the temperature $T_{TCM@Ls}$ to aged-state parameterized temperature $T_{vis\_ag@Ls}$. As the degree of the aging of the power element 120 becomes more and more serious, the error between the modeled temperature $T_{TCM}$ and the parameterized temperature $T_{Ref}$ under the same specific load Ls may also become larger and larger. In the third aspect of the invention, the controller 110 may set the permitted-temperature error ratio $\varepsilon_T$, and the initial error can be ignored while calculating the error between the modeled temperature $T_{TCM}$ and the parameterized temperature $T_{Ref}$. In response to the error between the modeled temperature $T_{TCM}$ and the parameterized temperature $T_{Ref}$ exceeding the permitted-temperature error ratio $\varepsilon_T$, the controller 110 may determine that the power element 120 has failed due to aging. For example, the controller 110 may determine whether the power element has failed due to aging using equation (3):

$$\left|\frac{T_{TCM} - T_{Ref}}{T_{TCM}}\right| > \varepsilon_T \quad (3)$$

In another embodiment, the controller 110 may determine whether the power element 120 has failed due to aging using the power-element parameter Ref. For example, under the specific load Ls, the power-element parameter corresponding to the modeled temperature is a fixed value of initial-state power-element parameter $Ref_{ini@Ls}$, which is approximately the same as the power-element parameter Ref. After the power element 120 has aged, the power-element parameter will change to aged-state power-element parameter $Ref_{ag@Ls}$, which is approximately the same as the modeled power-element parameter $Ref_{TCM}$. Accordingly, the controller 110 may define the permitted-temperature error ratio $\varepsilon_R$, and determine whether the power element 120 has failed due to aging using equation (2).

In the aforementioned embodiments in the third aspect of the invention, it is understood that the parameterized temperature may not be affected by the aging of the power element 120. However, in another embodiment in the third aspect of the invention, the parameterized temperature may be affected by the aging of the power element 120.

FIG. 7A is a diagram of the relationship between the load information and temperature in accordance with another embodiment in the third aspect of the invention. FIG. 7B is a diagram of the relationship between the power-element parameter and temperature in accordance with another embodiment in the third aspect of the invention.

As depicted in FIG. 7A and FIG. 7B, another curve 224 indicates the relationship between the aged-state power-element parameter and temperature. If the parameterized temperature is affected by the aging of the power element 120 and the real temperature $T_{Real\_ag@Ls}$ corresponding to the same power-element parameter after the aging of the power element 120 is greater than the aged-state parameterized temperature $T_{vis\_ag@Ls}$, it indicates that curve 224 is above curve 220. That is, while calculating the aged-state temperature $T_{Ref}$ of the power element 120, the parameterized temperature $T_{Ref}$ may be underestimated. Accordingly, in comparison with the value of the permitted-temperature error ratio $\varepsilon_T$ in the first aspect of the invention, the controller 110 has to define a smaller permitted-temperature error ratio $\varepsilon_T$ than in the embodiment in the third aspect of the invention.

Figures 7C, 7D:
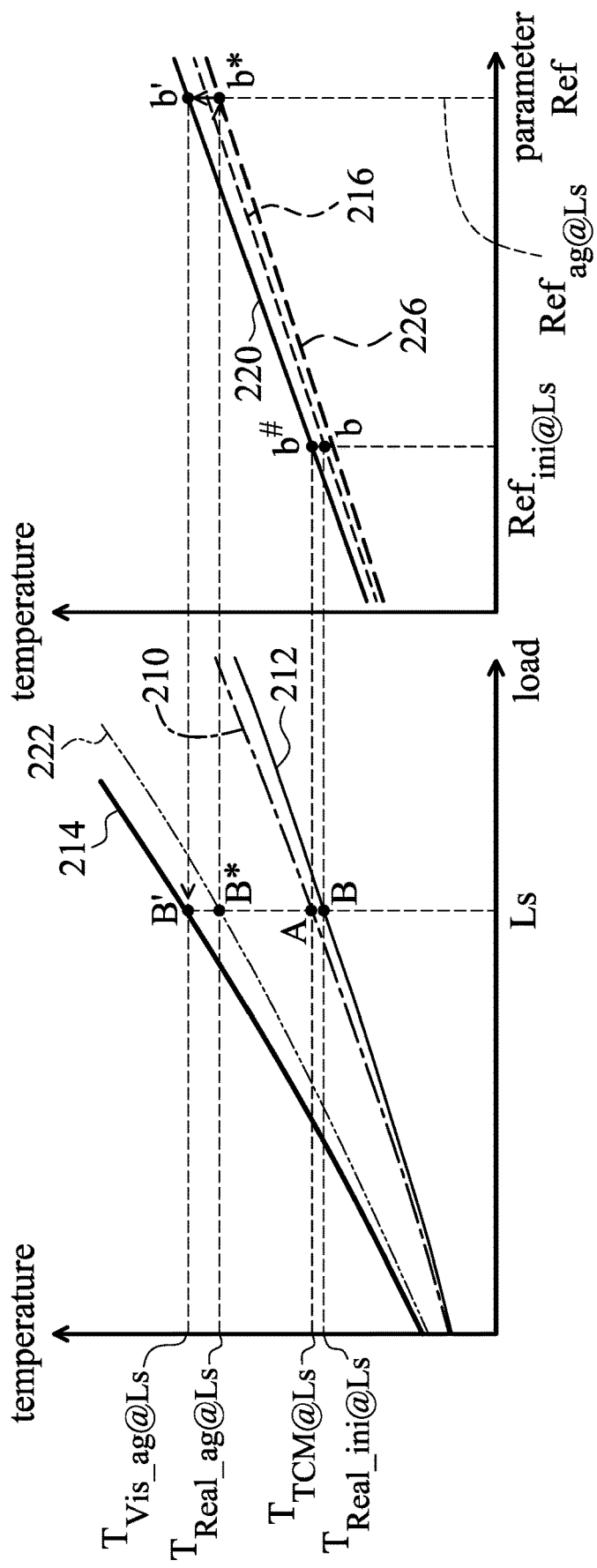
FIG. 7C is a diagram of the relationship between the load information and temperature in accordance with yet another embodiment in the third aspect of the invention.
FIG. 7D is a diagram of the relationship between the power-element parameter and temperature in accordance with yet another embodiment in the third aspect of the invention.

FIG. 7C is a diagram of the relationship between the load information and temperature in accordance with yet another embodiment in the third aspect of the invention. FIG. 7D is a diagram of the relationship between the power-element parameter and temperature in accordance with yet another embodiment in the third aspect of the invention.

As depicted in FIG. 7C and FIG. 7D, another curve 226 indicates the relationship between the aged-state power-element parameter and temperature. If the parameterized temperature is affected by the aging of the power element 120 and the real temperature $T_{Real\_ag@Ls}$ corresponding to the same power-element parameter after the aging of the power element 120 is smaller than the aged-state parameterized temperature $T_{vis\_ag@Ls}$, it indicates that curve 226 is lower than curve 220. That is, while calculating the aged-state temperature $T_{Ref}$ of the power element 120, the parameterized temperature $T_{Ref}$ may be overestimated. Accordingly, in comparison with the value of the permitted-temperature error ratio $\varepsilon_T$ in the first aspect of the invention, the controller 110 has to define a greater permitted-temperature error ratio $\varepsilon_T$ than in the embodiment in the third aspect of the invention.

Figure 8:
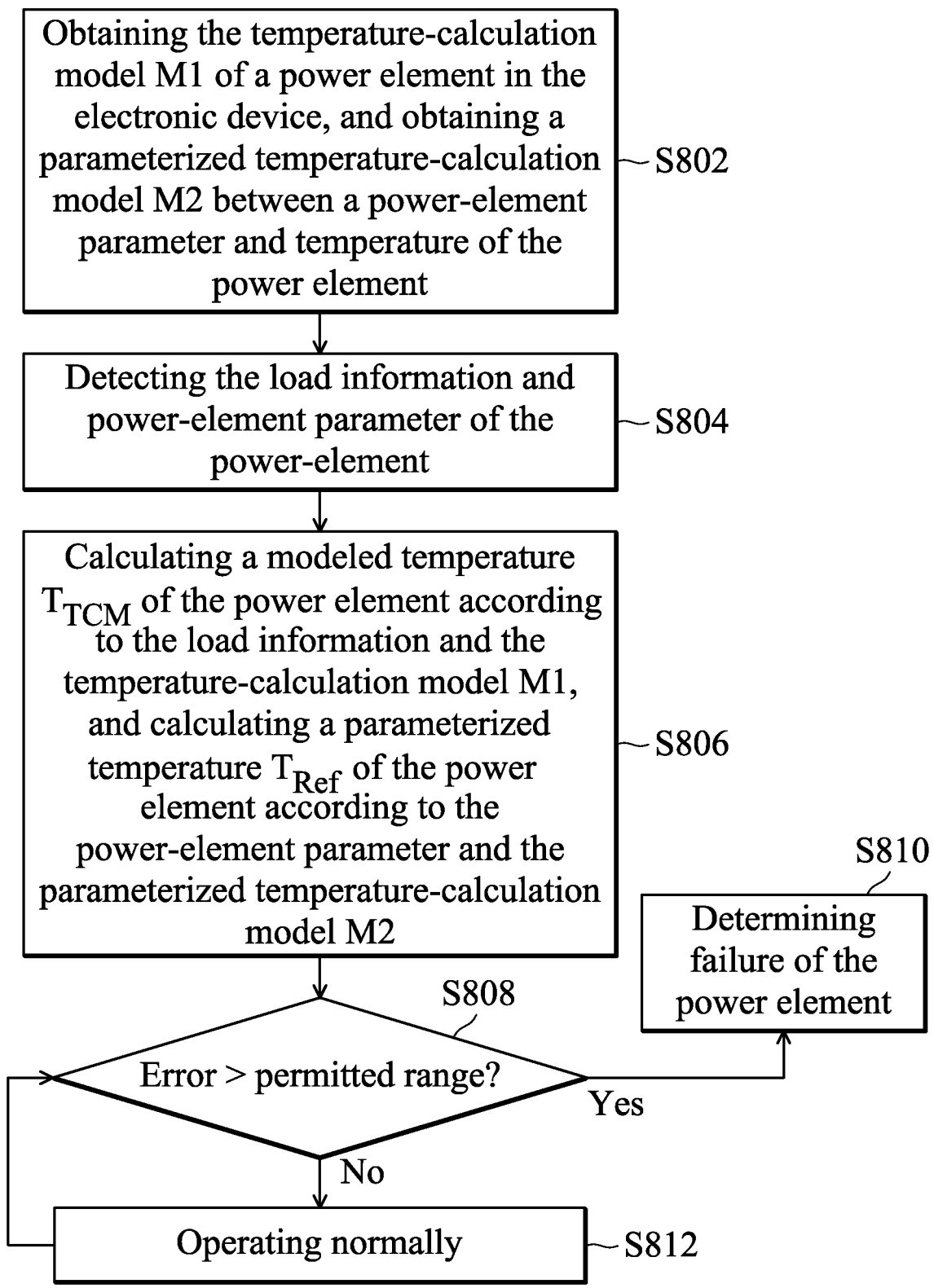
FIG. 8 is a flow chart of a method for determining failure of a power element in accordance with an embodiment of the third aspect in the invention.

FIG. 8 is a flow chart of a method for determining failure of a power element in accordance with an embodiment of the third aspect of the invention.

Referring both FIG. 1 and FIG. 8, in step S802, the temperature-calculation model M1 of a power element 120 under test in the electronic device 100 is obtained, and a parameterized temperature-calculation model M2 between the power-element parameter and the temperature of the power element 120 under test is obtained. For example, the temperature-calculation model M1 and the parameterized temperature-calculation model M2 can be pre-stored in a non-volatile memory (not shown in FIG. 1) of the electronic device 100. Upon the electronic device 100 being activated, the controller 110 may read out the temperature-calculation model M1 and the parameterized temperature-calculation model M2 from the non-volatile memory before the electronic device 100 is operating. Accordingly, during the operation of the electronic device 100, the controller 110 may utilize the detection circuit 130 to detect the load information corresponding to the power element 120, and then input the detected load information into the temperature-calculation model M1 to calculate the modeled temperature $T_{TCM}$ in real-time.

In step S804, the load information and power-element parameter of the power-element 120 under test are detected. In some embodiments, the load information may include the power-element parameter. It should be noted that different power elements may have different load information and power-element parameters, and the detection circuits 130 are designed for various of power elements, thereby detecting the load information and power-element parameters Ref with respect to different power elements.

In step S806, a modeled temperature $T_{TCM}$ of the power element 120 under test is calculated according to the load information and the temperature-calculation model M1, and a parameterized temperature $T_{Ref}$ of the power element 120 under test is calculated according to the power-element parameter and the parameterized temperature-calculation model M2. During the operation of the electronic device 100, the controller 110 may utilize the detection circuit 130 to detect the load information corresponding to the power element 120, and then input the detected load information into the temperature-calculation model M1 to calculate the modeled temperature $T_{TCM}$ in real-time and calculate the parameterized temperature $T_{Ref}$ of the power element 120 under test using the relationship between the power-element parameter and the temperature-calculation model M1.

In step S808, it is determined whether the error between the modeled temperature $T_{TCM}$ and the parameterized temperature $T_{Ref}$ exceeds the permitted range. For example, the permitted range may be the permitted-temperature error ratio $\varepsilon_T$ set by the controller 110, and the controller 110 may perform the determination according to equation (3).

If the error between the modeled temperature $T_{TCM}$ and the parameterized temperature $T_{Ref}$ exceeds the permitted range, the controller 110 may determine that the power element 120 has failed (step S810), and perform the subsequent shutdown procedure to facilitate replacement of the power element 120.

If the error between the modeled temperature $T_{TCM}$ and the parameterized temperature $T_{Ref}$ does not exceed the permitted range, the controller 110 may control the electronic device 100 to operate normally (step S812), and the flow goes back to step S808 to keep determining whether the error between the modeled temperature $T_{TCM}$ and the parameterized temperature $T_{Ref}$ exceeds the permitted range.

Specifically, in the flow of FIG. 8, the controller 110 performs the determination according to the temperature.

It should be noted that, in some embodiments, the second aspect of the invention can be incorporated with the third aspect of the present invention. For example, if the determination result of step S808 in FIG. 8 is "Yes", the controller 110 may update the temperature-calculation model M1 according to the parameterized temperature $T_{Ref}$ in step S810.

Figure 9:
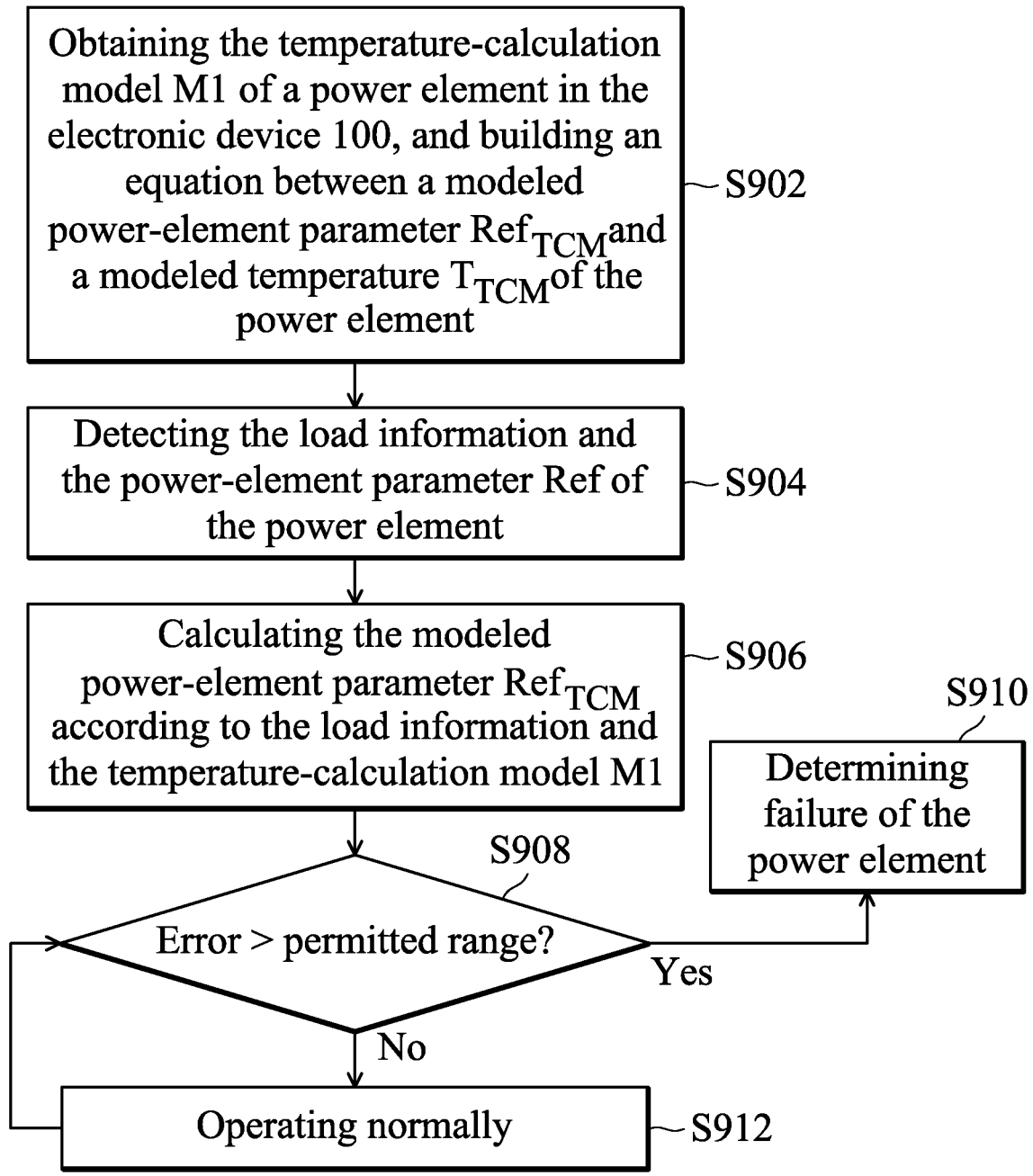
FIG. 9 is a flow chart of a method for determining failure of a power element in accordance with another embodiment of the third aspect of the invention.

FIG. 9 is a flow chart of a method for determining failure of a power element in accordance with another embodiment of the third aspect of the invention.

Referring to FIG. 1 and FIG. 9, in step S902, the temperature-calculation model M1 of a power element 120 under test in the electronic device 100 is obtained, and an equation (e.g., the first equation) between a modeled power-element parameter $Ref_{TCM}$ and a modeled temperature $T_{TCM}$ of the power element 120 under test is obtained. For example, the power-element parameter Ref can be regarded as a function of the parameterized temperature $T_{Ref}$, such as $Ref=f(T_{Ref})$.

In step S904, the load information and the power-element parameter Ref of the power element 120 under test are detected.

In step S906, the modeled power-element parameter $Ref_{TCM}$ is calculated according to the load information and the temperature-calculation model M1 using the method described in the first aspect of the invention. During the operation of the electronic device 100, the controller 110 may use the detection circuit 130 to detect the load information of the power element 120 in real-time, and then the detected load information is input to the temperature-calculation model M1 to calculate the modeled temperature $T_{TCM}$ that is input to the relationship between the modeled temperature $T_{TCM}$ and the modeled power-element parameter $Ref_{TCM}$ to calculate the modeled power-element parameter $Ref_{TCM}$.

In step S908, it is determined whether the error between the modeled power-element parameter $Ref_{TCM}$ and the power-element parameter Ref exceeds the permitted range. For example, the permitted range may be the permitted-parameter error ratio $\varepsilon_R$ set by the controller 110, and the controller 110 performs the determination according to equation (2).

If the error between the modeled power-element parameter $Ref_{TCM}$ and the power-element parameter Ref exceeds the permitted range, the controller 110 may determine that the power element 120 has failed (step S910), and perform the subsequent shutdown procedure to facilitate replacement of the power element 120.

If the error between the modeled power-element parameter $Ref_{TCM}$ and the power-element parameter Ref does not exceed the permitted range, the controller 110 controls the electronic device 100 to operate normally (step S912), and the flow goes back to step S908 to keep determining whether the error between the modeled power-element parameter $Ref_{TCM}$ and the power-element parameter Ref exceeds the permitted range.

Specifically, in the flow of FIG. 9, the controller performs the determination according to the power-element parameter.

In the fourth aspect of the invention, a portion of the first and third aspects of the invention can be extended described, such as the parameterized temperature $T_{Ref}$ being affected by multiple power-element parameters. In an embodiment, if the power-element parameters are non-aging parameters, as described in the embodiment of the first aspect of the invention, the controller 110 may determine whether the power element 120 has failed due to aging according to the temperature using equation (1).

If the parameterized temperature $T_{Ref}$ is obtained from the temperature-calculation model M1, as described in the embodiment of the third aspect of the invention, the initial-state temperature error ratio $\varepsilon_0$ is zero.

In another embodiment, the controller 110 may determine whether the power element 120 has failed due to aging according to the power-element parameter. In the initial state, the power-element parameter corresponding to the modeled temperature $T_{TCM@Ls}$ under the specific load Ls is a fixed vector $\overrightarrow{Ref_{ini@Ls}}$, which can be expressed as ($Ref1_{ini@Ls}$, $Ref2_{ini@Ls}$), wherein Ref1 denotes the first power-element parameter, and Ref2 denotes the second power-element parameter.

When the power element 120 has aged (i.e., in the aged state), the power-element parameter corresponding to the modeled temperature $T_{TCM@Ls}$ under the specific load Ls is a fixed vector $\overrightarrow{Ref_{ag@Ls}}$, which can be expressed as ($Ref1_{ag@Ls}$, $Ref2_{ag@Ls}$). Meanwhile, the controller 110 may define the permitted-parameter error ratio as $|\overrightarrow{\varepsilon_R}|$, and the controller 110 may determine whether the power element 120 has failed due to aging according to equation (4):

$$\left| \frac{\overrightarrow{Ref_{ini}} - \overrightarrow{Ref_{ag}}}{\overrightarrow{Ref_{ini}}} \right| > \varepsilon_R \tag{4}$$

Figure 10A:
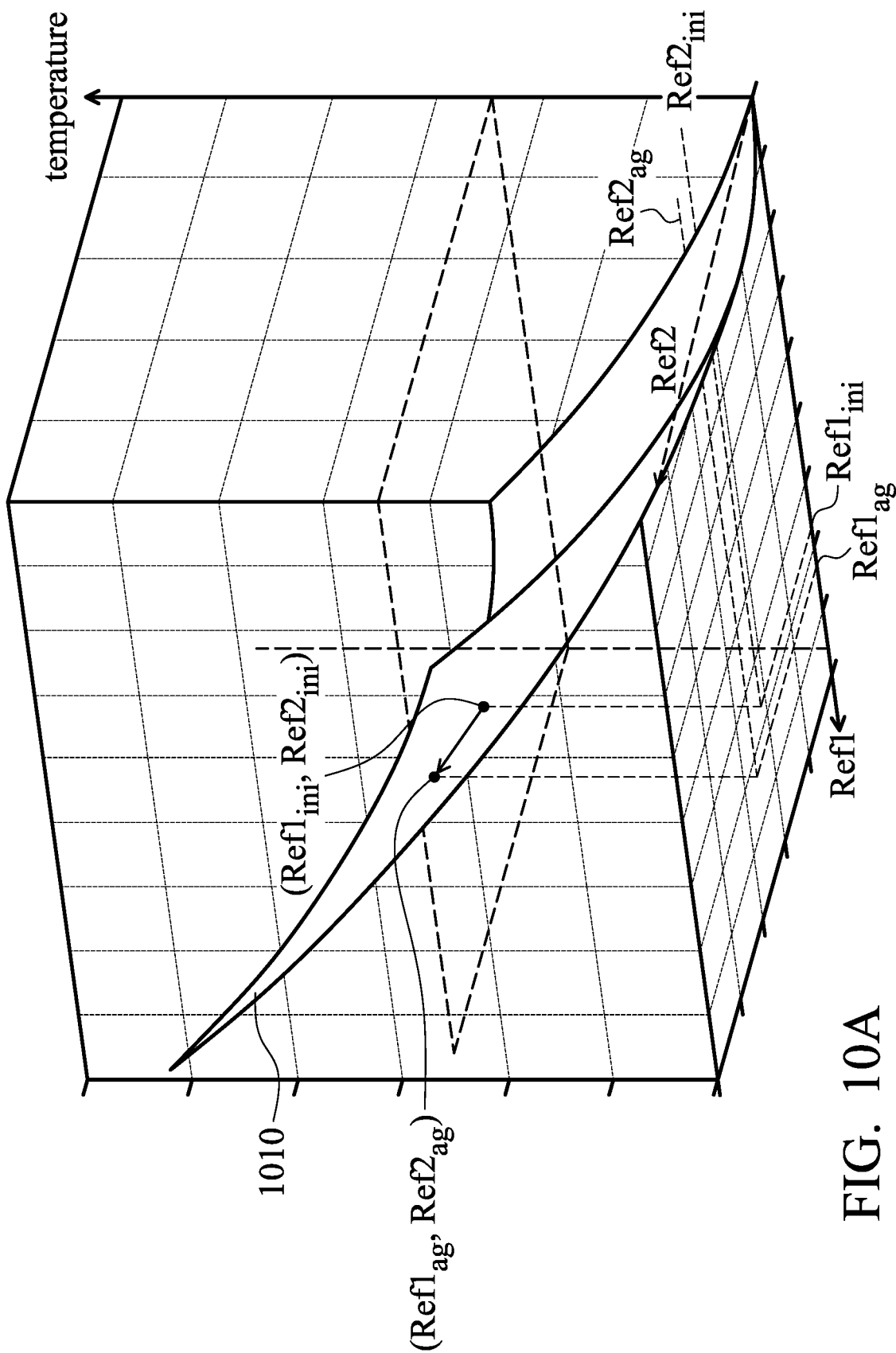
FIG. 10A is a diagram of the relationship between two power-element parameters and temperature in accordance with an embodiment in the fourth aspect of the invention.

FIG. 10A is a diagram of the relationship between two power-element parameters and temperature in accordance with an embodiment in the fourth aspect of the invention.

In an embodiment in the fourth aspect of the invention, the parameter temperature $T_{Ref}$ is determined by the first power-element parameter Ref1 and the second power-element parameter Ref2, and both the first power-element parameter Ref1 and the second power-element parameter Ref2 are non-aging parameters. As depicted in FIG. 10A, before and after the aging of the power element 120, the relationship between the first power-element parameter Ref1 and the second power-element parameter Ref2 and temperature is maintained on the same curved surface 1010. After the power element 120 has aged, the corresponding power-element parameters of the corresponding temperature will also change, such as the vector of the power-element parameters changing from ($\text{Ref1}_{ini}$, $\text{Ref2}_{ini}$) to ($\text{Ref1}_{ag}$, $\text{Ref2}_{ag}$). In the embodiment, the controller 110 may determine whether the power element 120 has failed due to aging in a similar manner as described in the embodiments in the first aspect of the invention.

Figure 10B:
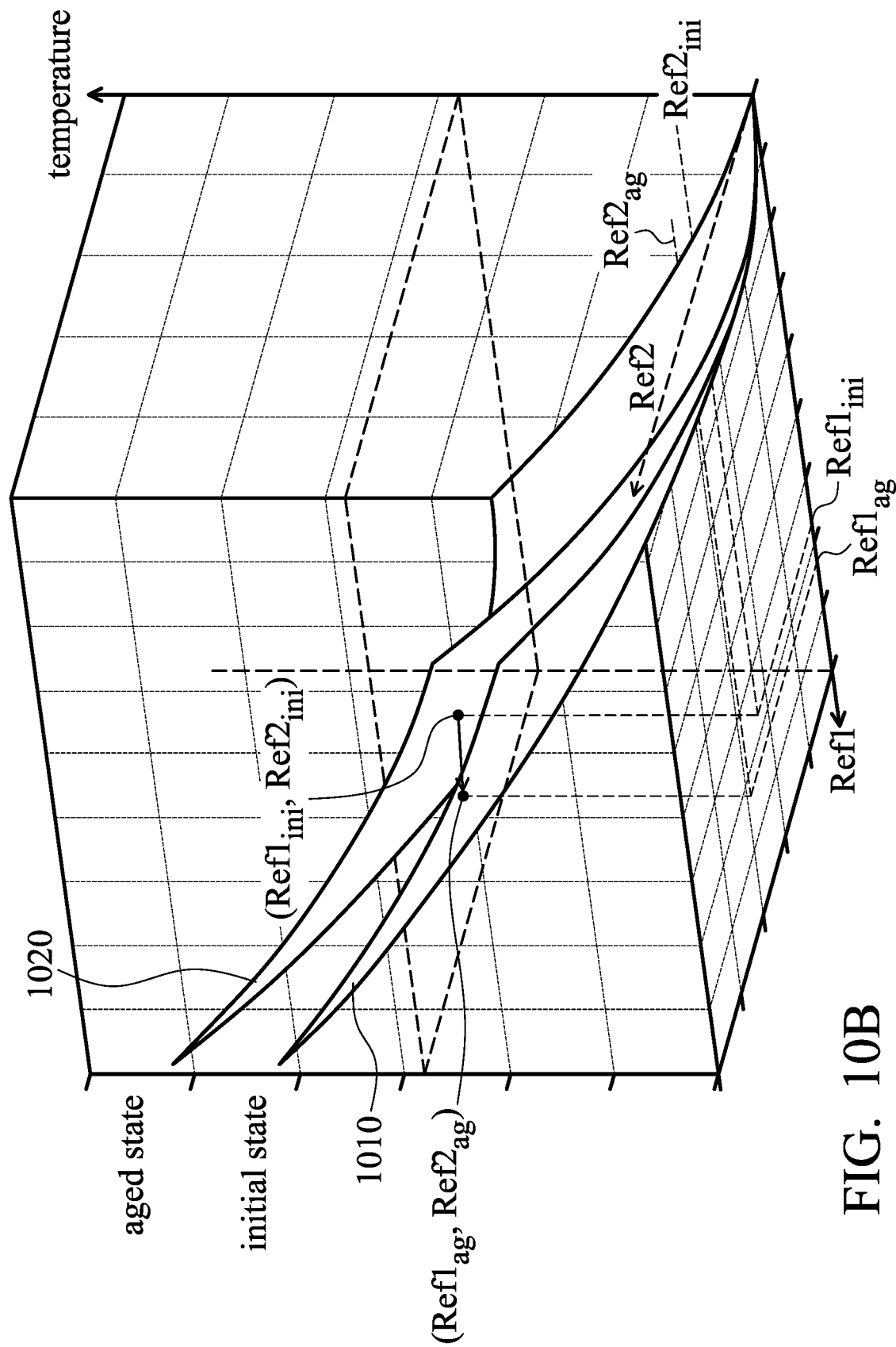
FIG. 10B is a diagram of the relationship between two power-element parameters and temperature in accordance with another embodiment in the fourth aspect of the invention.

FIG. 10B is a diagram of the relationship between two power-element parameters and temperature in accordance with another embodiment in the fourth aspect of the invention.

In another embodiment in the fourth aspect of the invention, the parameter temperature $T_{Ref}$ is determined by the first power-element parameter Ref1 and the second power-element parameter Ref2, and both the first power-element parameter Ref1 and the second power-element parameter Ref2 are aging parameters. As depicted in FIG. 10B, before the aging of the power element 120, the relationship between the first power-element parameter Ref1 and the second power-element parameter Ref2 and temperature is maintained on the same curved surface 1010. After the power element 120 has aged, the relationship between the first power-element parameter Ref1 and the second power-element parameter Ref2 and temperature is changed to the curved surface 1020. That is, the corresponding power-element parameter of the same temperature will also change, such as the vector of the power-element parameters changing from ($\text{Ref1}_{ini}$, $\text{Ref2}_{ini}$) on the curved surface 1010 to ($\text{Ref1}_{ag}$, $\text{Ref2}_{ag}$) on the curved surface 1020. In the embodiment, the controller 110 may determine whether the power element 120 has failed due to aging in a similar manner as described in the embodiments in the second or fourth aspects of the invention.

In view of the above, various aspects for the method for determining failure of a power element are described in the aforementioned embodiments, and the advantages of the method may include: (1) being capable of determining in real-time whether the temperature of the power element under test is abnormal; (2) being capable of easily building the thermal model between the temperature and power-element parameter, and only the relationship of the power-element parameter with respect to temperature in the initial state being required; (3) being capable of building the relationship between the temperature and power-element parameter (e.g., temperature-calculation model M1 and parameterized temperature-calculation model M2) for each specific corresponding power element under test, and preventing calculation errors due to differences between batches, processes, and performances of the chips or the power elements. In addition, in various aspects of the present invention, the power-element parameters belonging to the aging parameter or the non-aging parameter may be respectively applied, and multiple power-element parameters can be considered in calculating the parameterized temperature, so that the invention can be widely applied to electronic devices with different configurations to accurately estimate whether the power element has failed.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for determining failure of a power element, for use in an electronic device, wherein the electronic device comprises a power element and a detection circuit, the method comprising the steps of:
   obtaining a temperature-calculation model of the power element, and obtaining a parameterized temperature-calculation model of a power-element parameter and a parameterized temperature of the power element;
   detecting load information and the power-element parameter by the detection circuit;
   calculating a modeled temperature of the power element according to the load information and the temperature-calculation model, and calculating the parameterized temperature of the power element according to the power-element parameter and the parameterized temperature-calculation model;
   determining whether an error between the modeled temperature and the parameterized temperature exceeds a permitted range; and
   determining that the power element has failed in response to the error exceeding the permitted range.

2. The method as claimed in claim 1, wherein the power-element parameter is a non-aging parameter.

3. The method as claimed in claim 2, wherein the power element is an insulated gate bipolar transistor (IGBT) module, and the load information comprises an environmental temperature, an operating voltage, an operating current, an output frequency, a switching frequency of the IGBT module, or a combination thereof, and the power-element parameter is a gate current of the IGBT module.

4. The method as claimed in claim 2, wherein the power element is a capacitor module, and the load information comprises an environmental temperature, an operating voltage, a ripple voltage, an input current, an input power factor, a frequency of the capacitor module, or a combination thereof.

5. The method as claimed in claim 1, further comprising:
   calibrating the temperature-calculation model according to the parameterized temperature in response to the error exceeding the permitted range.

6. The method as claimed in claim 1, wherein the parameterized temperature calculated by the parameterized temperature-calculation model is determined by the power-element parameter and another power-element parameter.

7. A method for determining failure of a power element, for use in an electronic device, wherein the electronic device comprises a power element and a detection circuit, the method comprising the steps of:
   obtaining a temperature-calculation model of the power element, and obtaining a first equation between a power-element parameter and a parameterized temperature of the power element;

building a second equation between a modeled temperature calculated by the temperature-calculation model and a corresponding modeled power-element parameter;

detecting a temperature of the power element by the detection circuit;

calculating the modeled power-element parameter according to the detected temperature and the second equation, and calculating the power-element parameter of the power element according to the detected temperature and the first equation;

determining whether an error between the modeled power-element parameter and the power-element parameter exceeds a permitted range; and determining that the power element has failed in response to the error exceeding the permitted range.

8. A method for determining failure of a power element, for use in an electronic device, wherein the electronic device comprises a power element and a detection circuit, the method comprising the steps of:

obtaining a temperature-calculation model of the power element;

building an equation between the temperature-calculation model, a power-element parameter and a parameterized temperature of the power element;

detecting load information and the power-element parameter by the detection circuit;

calculating a modeled temperature of the power element according to the load information and the temperature-calculation model, and calculating the parameterized temperature of the power element according to the power-element parameter and the temperature-calculation model;

determining whether an error between the modeled temperature and the parameterized temperature exceeds a permitted range; and determining that the power element has failed in response to the error exceeding the permitted range.

9. The method as claimed in claim 8, wherein the power-element parameter is an aging parameter.

10. The method as claimed in claim 8, further comprising:

calibrating the temperature-calculation model according to the parameterized temperature in response to the error exceeding the permitted range.

11. The method as claimed in claim 8, wherein the parameterized temperature calculated by the parameterized temperature-calculation model is determined by the power-element parameter.

12. A method for determining failure of a power element, for use in an electronic device, wherein the electronic device comprises a power element and a detection circuit, the method comprising the steps of:

obtaining a temperature-calculation model of the power element;

building an equation between a modeled power-element parameter and a modeled temperature of the power element;

detecting load information and a power-element parameter by the detection circuit;

calculating the modeled power-element parameter of the power element according to the load information and the temperature-calculation model by the equation;

determining whether an error between the modeled power-element parameter and the power-element parameter exceeds a permitted range; and determining that the power element has failed in response to the error exceeding the permitted range.

13. An electronic device, comprising:

a power element;

a detection circuit, configured to detect load information and a power-element parameter of the power element; and a controller, configured to obtain a temperature-calculation model of the power element, and obtain a parameterized temperature-calculation model of the power-element parameter and a parameterized temperature of the power element, wherein the controller is further configured to calculate a modeled temperature of the power element according to the load information and the temperature-calculation model, and calculate the parameterized temperature of the power element according to the power-element parameter and the parameterized temperature-calculation model, wherein the controller is further configured to determine whether an error between the modeled temperature and the parameterized temperature exceeds a permitted range;

in response to the error exceeding the permitted range, the controller determines that the power element has failed, and in response to the error not exceeding the permitted range, the controller controls the electronic device to operate normally.

14. An electronic device, comprising:

a power element;

a detection circuit, configured to detect load information and a power-element parameter of the power element; and a controller, configured to obtain a temperature-calculation model of the power element, and build an equation between the temperature-calculation model, the power-element parameter and a parameterized temperature of the power element, wherein the controller is further configured to calculate a modeled temperature of the power element according to the load information and the temperature-calculation model, and calculate the parameterized temperature of the power element according to the power-element parameter and the temperature-calculation model by the equation;

wherein the controller is further configured to determine whether an error between the modeled temperature and the parameterized temperature exceeds a permitted range;

in response to the error exceeding the permitted range, the controller determines that the power element has failed; and in response to the error not exceeding the permitted range, the controller controls the electronic device to operate normally.

* * * * *